US009842654B2

(12) United States Patent
Lee et al.

(10) Patent No.: US 9,842,654 B2
(45) Date of Patent: Dec. 12, 2017

(54) NONVOLATILE MEMORY DEVICE WITH IMPROVED RELIABILITY AND OPERATING SPEED

(71) Applicants: Ji-Sang Lee, Iksan-si (KR); Donghun Kwak, Hwaseong-si (KR); Daeseok Byeon, Seongnam-si (KR); Chiweon Yoon, Seoul (KR)

(72) Inventors: Ji-Sang Lee, Iksan-si (KR); Donghun Kwak, Hwaseong-si (KR); Daeseok Byeon, Seongnam-si (KR); Chiweon Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/996,249

(22) Filed: Jan. 15, 2016

(65) Prior Publication Data

US 2017/0011799 A1    Jan. 12, 2017

(30) Foreign Application Priority Data

Jul. 6, 2015    (KR) ........................ 10-2015-0095752

(51) Int. Cl.
*G11C 11/34* (2006.01)
*G11C 16/10* (2006.01)
(Continued)

(52) U.S. Cl.
CPC .......... *G11C 16/10* (2013.01); *G11C 11/5628* (2013.01); *G11C 11/5642* (2013.01);
(Continued)

(58) Field of Classification Search
None
See application file for complete search history.

(56) References Cited

U.S. PATENT DOCUMENTS 7,679,133 B2    3/2010   Son et al.
7,859,902 B2   12/2010   Maejima
(Continued)

FOREIGN PATENT DOCUMENTS

JP    2011-090734 A     5/2011
JP    2013-211067 A    10/2013
(Continued)

*Primary Examiner* — Harry W Byrne
*Assistant Examiner* — Sultana Begum
(74) *Attorney, Agent, or Firm* — Volentine & Whitt, PLLC

(57) ABSTRACT

A nonvolatile memory includes a memory cell array, a row decoder circuit, and a page buffer circuit. The row decoder circuit applies a turn-on voltage to string selection lines, which are connected to string selection transistors of a selected memory block, at a first precharge operation in response to a write command received from an external device. The page buffer circuit applies, in response to the write command, a first voltage to bit lines, which are connected to the string selection transistors, through a first precharge circuit at the first precharge operation regardless of loaded data and applies the first voltage and a second voltage to the bit lines through a second precharge circuit at a second precharge operation based on the loaded data. During the first precharge operation, write data is loaded onto the page buffer circuit.

15 Claims, 16 Drawing Sheets

(51) Int. Cl.
 *G11C 16/26* (2006.01)
 *G11C 16/04* (2006.01)
 *G11C 16/24* (2006.01)
 *G11C 11/56* (2006.01)

(52) U.S. Cl.
 CPC .......... *G11C 16/0483* (2013.01); *G11C 16/24* (2013.01); *G11C 16/26* (2013.01)

(56) References Cited

U.S. PATENT DOCUMENTS

| | | |
|---|---|---|
| 7,986,573 B2 | 7/2011 | Li |
| 8,009,488 B2 | 8/2011 | Park et al. |
| 8,094,510 B2 | 1/2012 | Scheuerlein |
| 8,254,193 B2 | 8/2012 | Fujieda |
| 8,351,274 B2 | 1/2013 | Ha et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,824,232 B2 | 9/2014 | Yoo et al. |
| 8,902,659 B2 | 12/2014 | Chan |
| 2003/0021172 A1* | 1/2003 | Cho ............... G11C 7/1051 365/203 |
| 2007/0109862 A1* | 5/2007 | Kim ............... G11C 8/08 365/185.19 |
| 2007/0230253 A1* | 10/2007 | Kim ............... G11C 8/08 365/185.29 |
| 2011/0233648 A1 | 9/2011 | Seol et al. |
| 2013/0258789 A1 | 10/2013 | Takahashi |
| 2015/0078098 A1 | 3/2015 | Kwak et al. |
| 2015/0155026 A1 | 6/2015 | Kim |
| 2015/0155040 A1 | 6/2015 | Shim |
| 2016/0027513 A1 | 1/2016 | Lee |

FOREIGN PATENT DOCUMENTS

| | | |
|---|---|---|
| KR | 10-2009-0110494 A | 10/2009 |
| KR | 10-1099835 B1 | 12/2011 |
| KR | 10-2012-0005840 A | 1/2012 |
| KR | 10-2012-0114274 A | 10/2012 |
| KR | 10-2014-0026115 A | 3/2014 |
| KR | 10-2015-0008377 A | 1/2015 |
| KR | 10-2015-0063848 A | 6/2015 |
| KR | 10-2015-0064880 A | 6/2015 |
| KR | 10-2016-0012888 A | 2/2016 |

* cited by examiner

NONVOLATILE MEMORY DEVICE WITH IMPROVED RELIABILITY AND OPERATING SPEED

CROSS-REFERENCE TO RELATED APPLICATIONS

A claim for priority under 35 U.S.C. §119 is made to Korean Patent Application No. 10-2015-0095752 filed Jul. 6, 2015, in the Korean Intellectual Property Office, the entire contents of which are hereby incorporated by reference.

BACKGROUND

Embodiments of the disclosure relate to a semiconductor circuit, and more particularly, to a nonvolatile memory device.

A storage device is a device that stores data in response to a control of a host device, such as a computer, a smartphone, a smart pad, and the like. The storage device contains a device (e.g., hard disk drive (HDD)), which stores data on a magnetic disk, or a semiconductor memory, such as solid state drive (SSD) or memory card, in particular, a device which stores data on a nonvolatile memory.

A nonvolatile memory includes a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), or a ferroelectric RAM (FRAM).

With the advancement of the semiconductor fabrication technology, the capacity and the degree of integration of the nonvolatile memory continue to increase. The high integration of the storage device makes it possible to reduce a production cost thereon; however, a decrease in a scale of the storage device and a change in a structure due to the high integration of the storage device cause various problems which are not found previously. For example, data stored at the storage device is damaged due to such problems, thereby lowering the reliability of the storage device. A method and a device capable of improving the reliability of the storage device are required.

Furthermore, with the advancement of the semiconductor fabrication technology, an operating speed of a host device, communicating with the storage device, such as a computer, a smart phone, a smart pad, or the like is being improved. In addition, the capacity of contents which the storage device and the host device of the storage device use is being increased. For these reasons, it is necessary to further improve the operating speed of the storage device.

SUMMARY

Embodiments of the disclosure are directed to provide a nonvolatile memory device with improved reliability and operating speed.

One aspect of embodiments of the disclosure is directed to provide a nonvolatile memory device. The nonvolatile memory device may include a memory cell array including a plurality of memory blocks, each including a plurality of cell strings and each cell string including a ground selection transistor, a plurality of memory cells, and a string selection transistor. A row decoder circuit of the nonvolatile memory device is configured to apply a turn-on voltage to string selection lines, which are connected to string selection transistors of a selected memory block, at a first precharge operation in response to a write command received from an external device. A page buffer circuit of the nonvolatile memory device is configured to apply, in response to the write command, a first voltage to bit lines, which are connected to the string selection transistors, through a first precharge circuit at the first precharge operation regardless of loaded data and to apply the first voltage and a second voltage lower than the first voltage to the bit lines through a second precharge circuit at a second precharge operation based on the loaded data. During the first precharge operation, write data may be loaded onto the page buffer circuit.

Another aspect of embodiments of the disclosure is directed to provide a nonvolatile memory device. The nonvolatile memory device may include a memory cell array including a plurality of memory blocks, each including a plurality of cell strings and each cell string including a ground selection transistor, a plurality of memory cells, and a string selection transistor. A row decoder circuit of the nonvolatile memory device is configured to apply a turn-on voltage to string selection lines, connected to string selection transistors of a selected memory block, at a first precharge operation of each of a first program loop and a second program loop, in response to a write command received from an external device. A page buffer circuit of the nonvolatile memory device is configured to apply a first voltage to bit lines, connected to the string selection transistors, through a first precharge circuit regardless of loaded data at the first precharge operation of the second program loop and to apply a second voltage lower than the first voltage to the bit lines through a second precharge circuit at a second precharge operation of the second program loop based on the loaded data, in response to the write command. During the first precharge operation of the first program loop, the page buffer circuit may apply the first voltage and the second voltage to the bit lines through the second precharge circuit, based on the loaded data. Write data may be loaded onto the page buffer circuit before the first program loop.

Another aspect of embodiments of the disclosure is directed to provide a nonvolatile memory device including a memory cell array, having memory cells that are each addressed by one of a plurality of bit lines and one of a plurality of word lines. A controller of the nonvolatile memory device executes a voltage application operation on the memory cells. The controller applies, during a first pre-charge operation preceding the voltage application operation, a bit-line select signal to each of the bits lines and applies, during the execution of the voltage application operation, one of a plurality of word-line signals to each of the word lines.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Below, embodiments of the disclosure will be described with reference to the accompanying drawings in order to describe the embodiments of the disclosure in detail to the extent that one skilled in the art can easily implement the scope and spirit of the disclosure.

Figure 1:
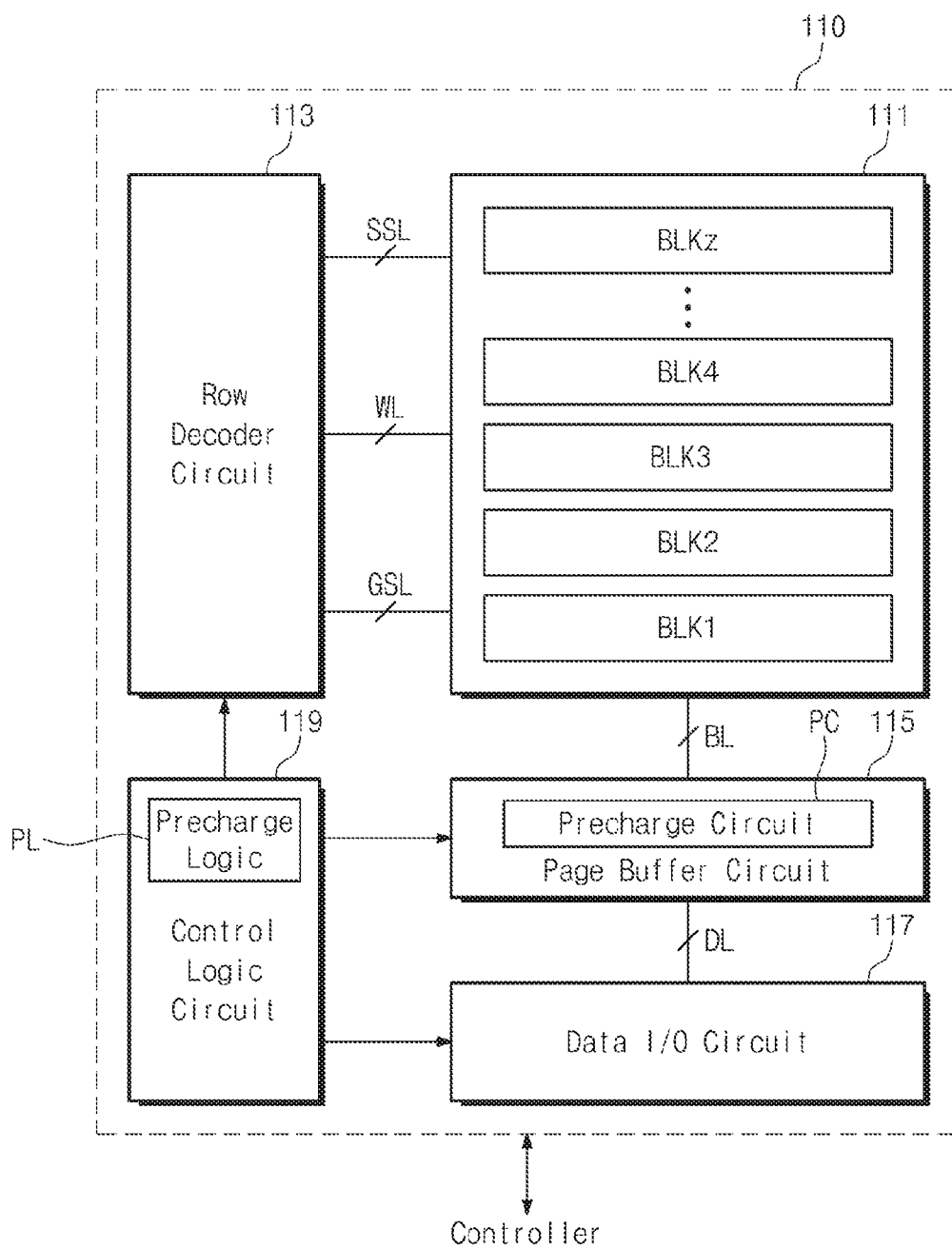
FIG. 1 is a block diagram schematically illustrating a nonvolatile memory according to an embodiment of the disclosure.

FIG. 1 is a block diagram schematically illustrating a nonvolatile memory 110 according to an embodiment of the disclosure. Referring to FIG. 1, a nonvolatile memory 110 may include a memory cell array 111, a row decoder circuit 113, a page buffer circuit 115, a data input/output circuit 117, and a control logic circuit 119.

The memory cell array 111 may include a plurality of memory blocks BLK1 through BLKz, each of which has a plurality of memory cells. Each memory block may be connected to the row decoder circuit 113 through at least one string selection line SSL, a plurality of word lines WL, and at least one ground selection line GSL. Each memory block may be connected to the page buffer circuit 115 through a plurality of bit lines BL. The memory blocks BLK1 through BLKz may be connected in common to the plurality of bit lines BL. Memory cells in the memory blocks BLK1 through BLKz may have the same structure.

In exemplary embodiments, each of the memory blocks BLK1 through BLKz may be a unit of an erase operation. An erase operation may be carried out by the memory block. Memory cells in a memory block may be erased at the same time. In other exemplary embodiments, each memory block may be divided into a plurality of sub-blocks. Erasing may be made by the sub-block.

In exemplary embodiments, each of the memory blocks BLK1 to BLKz may include a physical storage space which is distinguished by a block address. Each of the word lines WL may correspond to a physical storage space which is distinguished by a row address. Each of the bit lines BL may correspond to a physical storage space which is distinguished by a column address.

The row decoder circuit 113 may be connected to the memory cell array 111 through a plurality of ground selection lines GSL, the plurality of word lines WL, and a plurality of string selection lines SSL. The row decoder circuit 113 may operate in response to a control of the control logic circuit 119. The row decoder circuit 113 may decode an address received from a controller 120 through an input/output channel and may allow voltages to be applied to the string selection lines SSL, the word lines WL, and the ground selection lines GSL based on the decoded address.

For example, at programming, the row decoder circuit 113 may apply a program voltage to a selected word line in a memory block selected by an address. The row decoder circuit 113 may also apply a pass voltage to unselected word lines in the selected memory block. At reading, the row decoder circuit 113 may apply a selection read voltage to the selected word line in the selected memory block. The row decoder circuit 113 may also apply a non-selection read voltage to unselected word lines in the selected memory block. At erasing, the row decoder circuit 113 may apply an erase voltage (e.g., a ground voltage or a voltage of which the level is similar to that of the ground voltage) to word lines in the selected memory block.

The page buffer circuit 115 may be connected to the memory cell array 111 through the bit lines BL. The page buffer circuit 115 may be connected to the data input/output circuit 117 through a plurality of data lines DL. The page buffer circuit 115 may operate in response to a control of the control logic circuit 119.

During programming, the page buffer circuit 115 may store data to be programmed at memory cells. The page buffer circuit 115 may apply voltages to the bit lines BL based on the stored data. The page buffer circuit 115 may function as a write driver at a program operation. During reading, the page buffer circuit 115 may sense voltages on the bit lines BL and may store the sensed results. The page buffer circuit 115 may function as a sense amplifier at a read operation.

The page buffer circuit 115 may include a precharge circuit PC. The precharge circuit PC may apply specific voltages to the bit lines BL in starting a program operation or a read operation. For example, the precharge circuit PC may apply the same voltage to the bit lines BL or may apply different voltages thereto based on data loaded onto the page buffer circuit 115.

The data input/output circuit 117 may be connected to the page buffer circuit 115 through the data lines DL. The data input/output circuit 117 may output data, which is read by the page buffer circuit 115, to the controller 120 through the input/output channel and may transfer data, which is received from the controller 120 through the input/output channel, to the page buffer circuit 115.

The control logic circuit 119 may receive a command from the controller 120 through the input/output channel and may receive a control signal therefrom through a control channel. The control logic circuit 119 may receive a command, which is received through the input/output channel, in response to the control signal, may route an address, which is received through the input/output channel, to the row decoder circuit 113, and may route data, which is received through the input/output channel, to the data input/output circuit 117. The control logic circuit 119 may decode the received command and may control the nonvolatile memory device 110 based on the decoded command.

In exemplary embodiments, the control logic circuit 119 may generate a data strobe signal DQS based on a read enable signal /RE received from the controller 120 through the input/output channel. The data strobe signal DQS thus generated may be outputted to the controller 120 through the control channel. At writing, the control logic circuit 119 may receive the data strobe signal DQS from the controller 120 through the control channel.

The control logic circuit 119 may include precharge logic PL. The precharge logic PL may control the precharge circuit PC of the page buffer circuit 115. For example, the precharge logic PL may transfer various control signals controlling the page buffer circuit 115 to the precharge circuit PC.

Figure 2:
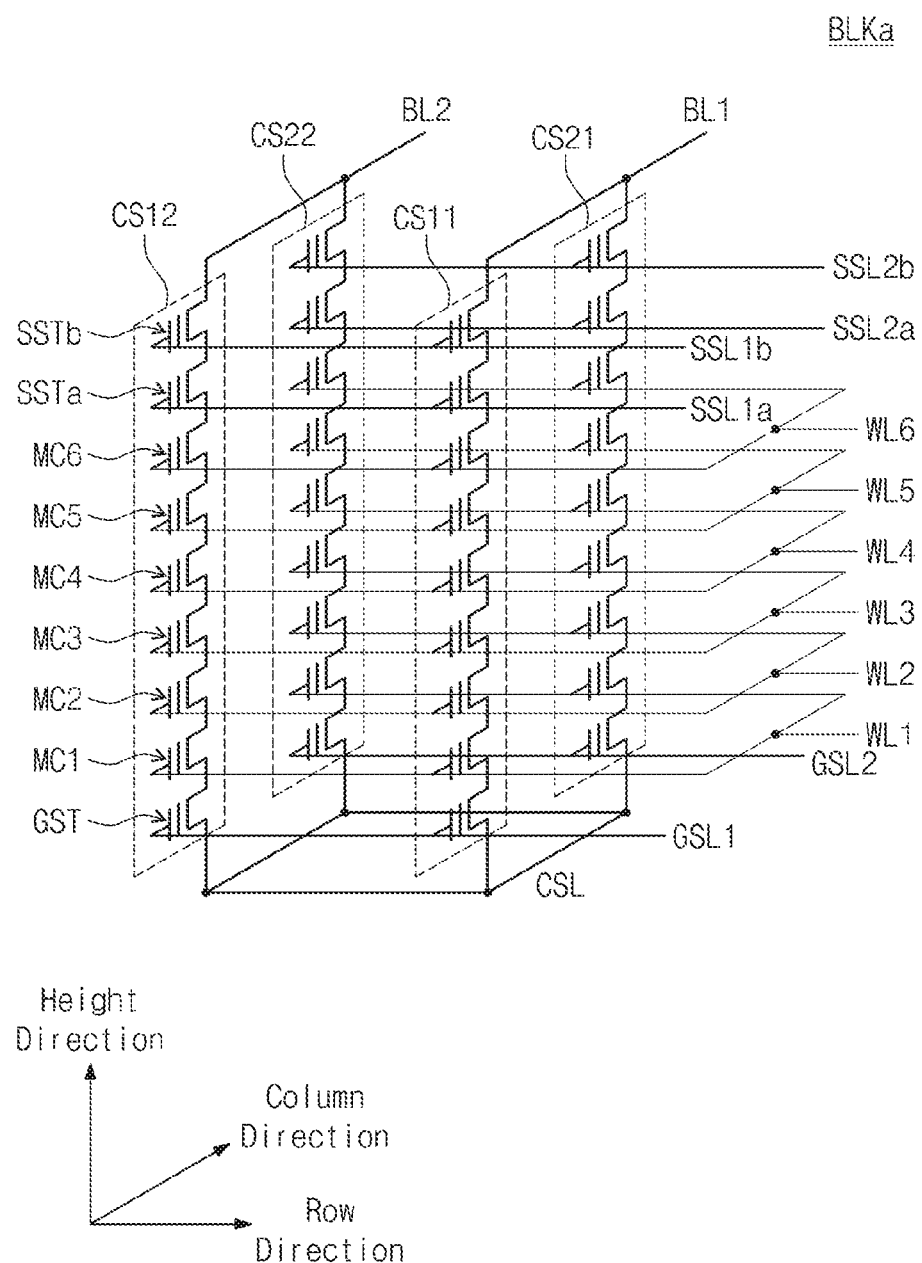
FIG. 2 is a circuit diagram schematically illustrating a memory block according to an exemplary embodiment of the disclosure.

FIG. 2 is a circuit diagram schematically illustrating a memory block BLKa according to an exemplary embodiment of the disclosure. Referring to FIG. 2, a memory block BLKa may include a plurality of cell strings CS11 to CS21 and CS12 to CS22. The plurality of cell strings CS11 to CS21 and CS12 to CS22 may be arranged in a matrix of rows and columns.

For example, the cell strings CS11 and CS12 arranged along a row direction may constitute a first row, and the cell strings CS21 and CS22 arranged along the row direction may constitute a second row. The cell strings CS11 and CS21 arranged along a column direction may constitute a first column, and the cell strings CS12 and CS22 arranged along the column direction may constitute a second column.

Each cell string may contain a plurality of cell transistors. The cell transistors may include ground selection transistors GST, memory cells MC1 through MC6, and string selection transistors SSTa and SSTb. The ground selection transistor GST, memory cells MC1 through MC6, and string selection transistors SSTa and SSTb in each cell string may be stacked in a height direction perpendicular to a plane (e.g., a plane on a substrate of the memory block BLKa) on which the cell strings CS11 to CS21 and CS12 to CS22 are arranged along the rows and the columns.

Each cell transistor may be a charge trap type cell transistor of which the threshold voltage varies according to the amount of charges trapped in an insulating layer thereof.

Lowermost ground selection transistors GST may be connected in common to a common source line CSL.

Control gates of ground selection transistors GST of the cell strings CS11 and CS12 in a first row may be connected in common to a ground selection line GSL1, and control gates of ground selection transistors GST of the cell strings CS21 and CS22 in a second row may be connected in common to a ground selection line GSL2a.

That is, cell strings in different rows may be connected to different ground selection lines.

In exemplary embodiments, the memory block BLKa may be modified or changed such that ground selection transistors belonging to the same row and placed at different heights are connected to different ground selection lines. In exemplary embodiments, the memory block BLKa may be modified or changed such that ground selection lines which are connected to ground selection transistors belonging to different rows and placed at the same height are interconnected and controlled in common. In exemplary embodiments, the memory block BLKa may be modified or changed such that ground selection lines which are connected to ground selection transistors are interconnected and controlled in common.

Connected in common to a word line are control gates of memory cells that are placed at the same height (or, order) from the substrate (or, the ground selection transistors GST). Connected to different word lines WL1 to WL6 are control gates of memory cells that are placed at different heights (or, orders). For example, the memory cells MC1 may be connected in common to the word line WL1, the memory cells MC2 may be connected in common to the word line WL2, and the memory cells MC3 may be connected in common to the word line WL3. The memory cells MC4 may be connected in common to the word line WL4, the memory cells MC5 may be connected in common to the word line WL5, and the memory cells MC6 may be connected in common to the word line WL6.

In first string selection transistors SSTa, having the same height (or, order), of the cell strings CS11 to CS21 and CS12 to CS22, control gates of the first string selection transistors SSTa in different rows may be connected to different string selection lines SSL1a and SSL2a, respectively. For example, the first string selection transistors SSTa of the cell strings CS11 and CS12 may be connected in common to the string selection line SSL1a, and the first string selection transistors SSTa of the cell strings CS21 and CS22 may be connected in common to the string selection line SSL2a.

In second string selection transistors SSTb, having the same height (or, order), of the cell strings CS11 to CS21 and CS12 to CS22, control gates of the second string selection transistors SSTb in different rows may be connected to the different string selection lines SSL1b and SSL2b. For example, the second string selection transistors SSTb of the cell strings CS11 and CS12 may be connected in common to the string selection line SSL1b, and the second string selection transistors SSTb of the cell strings CS21 and CS22 may be connected in common to the string selection line SSL2b.

That is, cell strings in different rows may be connected to different string selection lines. String selection transistors, having the same height (or, order), of cell strings in the same row may be connected to the same string selection line. String selection transistors, having different heights (or, orders), of cell strings in the same row may be connected to different string selection lines.

In exemplary embodiments, string selection transistors of cell strings in the same row may be connected in common to a string selection line. For example, the string selection transistors SSTa and SSTb of the cell strings CS11 and CS12 in the first row may be connected in common to a string selection line, and the string selection transistors SSTa and SSTb of the cell strings CS21 and CS22 in the second row may be connected in common to a string selection line.

Columns of the cell strings CS11 through CS21 and CS12 through CS22 may be connected to different bit lines BL1 and BL2, respectively. For example, the string selection transistors SSTb of the cell strings CS11 and CS21 in the first column may be connected in common to the bit line BL1, and the string selection transistors SSTb of the cell strings CS12 and CS22 in the second column may be connected in common to the bit line BL2.

The cell strings CS11 and CS12 may compose a first plane, and the cell strings CS21 and CS22 may compose a second plane.

In the memory block BLKa, memory cells of each plane placed at the same height may compose a physical page. A physical page may be a unit of writing and reading the memory cells MC1 to MC6. One plane of the memory block BLKa may be selected by the string selection lines SSL1a, SSL1b, SSL2a, and SSL2b. The cell strings CS11 and CS12 in a first plane may be connected to the bit lines BL1 and BL2 when a turn-on voltage is supplied to the string selection lines SSL1a and SSL1b and a turn-off voltage is supplied to the string selection lines SSL2a and SSL2b. That is, the first plane may be selected. The cell strings CS21 and CS22 in a second plane may be connected to the bit lines BL1 and BL2 when the turn-on voltage is supplied to the string selection lines SSL2a and SSL2b and the turn-off voltage is supplied to the string selection lines SSL1a and SSL1b. That is, the second plane may be selected. In a selected plane, a row of memory cells MC may be selected by the word lines WL1 to WL6. In the selected row, a selection voltage may be applied to the second word line WL2, and a non-selection voltage may be applied to the remaining word lines WL1 and WL3 to WL6. That is, a physical page which corresponds to the second word line WL2 of the second plane may be selected by adjusting voltages on the string selection lines SSL1a, SSL1b, SSL2a, and SSL2b and the word lines WL1 to WL6. A write or read operation may be performed with respect to memory cells MC2 in the selected physical page.

In the memory block BLKa, the memory cells MC1 to MC6 may be erased by the memory block or by the sub-block. When erasing is performed by the memory block, all memory cells MC in the memory block BLKa may be simultaneously erased according to an erase request (e.g., an erase request from an external memory controller). When erasing is performed by the sub-block, a portion of memory cells MC in the memory block BLKa may be simultaneously erased according to an erase request (e.g., an erase request from an external memory controller), and the other thereof may be erase-inhibited. A low voltage (e.g., a ground voltage or a low voltage of which the level is similar to that of the ground voltage) may be supplied to a word line connected to erased memory cells MC, and a word line connected to erase-inhibited memory cells MC may be floated.

In exemplary embodiments, the memory block BLKa may include a physical storage space which is distinguished by a block address. Each of the word lines WL1 to WL6 may correspond to a physical storage space which is distinguished by a row address. Each of the bit lines BL1 and BL2 may correspond to a physical storage space which is distinguished by a column address. Each of string selection lines SSL1a and SSL2a or SSL1b and SSL2b in different rows or each of the ground selection lines GSL1 and GSL2 in different rows may correspond to a physical storage space which is identified by a plane address.

The memory block BLKa shown in FIG. 2 is exemplary. However, the scope and spirit of the disclosure may not be limited thereto. For example, the number of rows of cell strings may increase or decrease. When the number of rows of cell strings is changed, the number of string or ground selection lines and the number of cell strings connected to a bit line may also be changed.

The number of columns of cell strings may increase or decrease. If the number of columns of cell strings is changed, the number of bit lines connected to columns of cell strings and the number of cell strings connected to a string selection line may also be changed.

A height of the cell strings may increase or decrease. For example, the number of ground selection transistors, memory cells, or string selection transistors that are stacked in each cell string may increase or decrease.

In exemplary embodiments, memory cells MC in a physical page may correspond to at least three logical pages. For example, k bits (k being an integer of 2 or more) may be programmed at a memory cell MC. In memory cells MC of one physical page, k logical pages may be implemented with k bits programmed at each memory cell MC.

For example, a physical page may include a physical storage space which is distinguished by a block address, a row address, a column address, and a plane address. One physical page may include two or more logical pages. Each of the logical pages may include a logical storage space which is distinguished by an additional address (or an offset) for identifying logical pages as well as an address of a physical address.

In an embodiment of the present disclosure, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present disclosure, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 3:
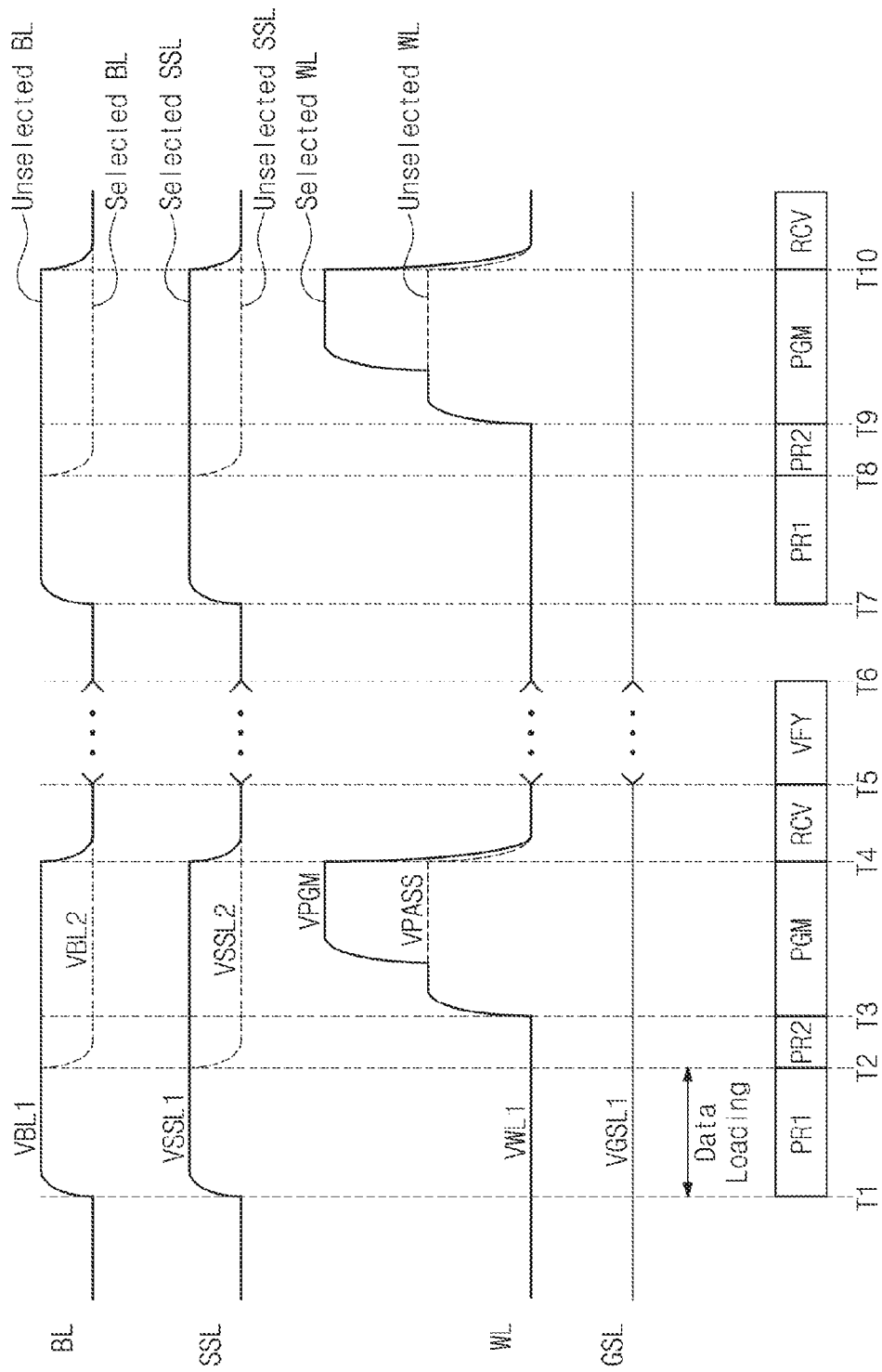
FIG. 3 is a timing diagram schematically illustrating an embodiment in which a row decoder circuit and a page buffer circuit apply voltages to a memory cell array.

FIG. 3 is a timing diagram schematically illustrating an embodiment in which a row decoder circuit 113 and a page buffer circuit 115 apply voltages to a memory cell array 111. In FIG. 3, the abscissa represents time, and the ordinate represents voltages of bit lines BL, string selection lines SSL, word lines WL, and ground selection lines GSL. In exemplary embodiments, changes in voltages when data is written at memory cells MC may be illustrated in FIG. 3.

Referring to FIGS. 1 to 3, a program loop may be executed between a first time T1 and a sixth time T6. The program loop may include a first precharge operation PR1, a second precharge operation PR2, a program operation PGM, a recovery operation RCV, and a verification operation VFY.

The first precharge operation PR1 may be performed between the first time T1 and the second time T2. During the first precharge operation PR1, the row decoder circuit 113 may apply first string selection line voltages VSSL1 to string selection lines SSL of a selected memory block, respectively. The first string selection line voltages VSSL1 may be applied to string selection lines SSL1a, SSL1b, SSL2a, and SSL2b, respectively. The first string selection line voltages VSSL1 may be turn-on voltages for turning on string selection transistors SSTa and SSTb. For example, the first string selection line voltages VSSL1 may be a power supply voltage or positive voltages of which the levels are similar to that of the power supply voltage. The first string selection line voltages VSSL1 may be voltages which are the same as each other or different from each other.

During the first precharge operation PR1, the precharge circuit PC of the page buffer circuit 115 may apply first bit line voltages VBL1 to bit lines BL. The first bit line voltages VBL1 may be respectively applied to a first bit line BL1 and a second bit line BL2 regardless of write data or data loaded onto the page buffer circuit 115. The first bit line voltages VBL1 may be the power supply voltage or positive voltages of which the levels are similar to the power supply voltage. The first bit line voltages VBL1 may be voltages which are the same as each other or different from each other.

The row decoder circuit 113 may apply first word line voltages VWL1 to word lines WL, respectively. The first word line voltages VWL1 may be applied respectively to first to sixth word lines WL1 to WL6 of the selected memory block. The first word line voltages VWL1 may be voltages for turning off (or turning on) memory cells MC1 to MC6. The first word line voltages VWL1 may be a ground voltage or voltages of which the levels are similar to that of the ground voltage. The first word line voltages VWL1 may be voltages which are the same as each other or different from each other.

The row decoder circuit 113 may apply first ground selection line voltages VGSL1 to the ground selection lines GSL. The first ground selection line voltages VGSL1 may be applied to first and second ground selection lines GSL1 and GSL2 of the selected memory block. The first ground selection line voltages VGSL1 may be voltages for turning off (or turning on) ground selection transistors GST. The first ground selection line voltages VGSL1 may be a ground voltage or voltages of which the levels are similar to that of the ground voltage. The first ground selection line voltages VGSL1 may be voltages which are the same as each other or different from each other.

During the first precharge operation PR1, the string selection transistors SSTa and SSTb may be turned on. The first bit line voltages VBL1 supplied to the bit lines BL1 and BL2 may be transferred to the memory cells MC6 through the turned-on string selection transistors SSTa and SSTb.

The second precharge operation PR2 may be carried out between the second time T2 and the third time T3. During the second precharge operation PR2, the row decoder circuit 113 may apply the first string selection line voltages VSSL1 to selected string selection lines in the selected memory block, that is, string selection lines in a selected plane. For example, during the second precharge operation PR2, the row decoder circuit 113 may maintain voltages which are applied to selected string selection lines during the first precharge operation PRE The row decoder circuit 113 may apply second string selection line voltages VSSL2 to unselected string selection lines of the selected memory block, that is, string selection lines in an unselected plane. The second string selection line voltages VSSL2 may be voltages for turning off the string selection transistors SSTa and SSTb. The second string selection line voltages VSSL2 may be a ground voltage or voltages of which the levels are similar to that of the ground voltage. The second string selection line voltages VSSL2 may be voltages which are the same as each other or different from each other.

During the second precharge operation PR2, the precharge circuit PC of the page buffer circuit 115 may adjust voltages on the bit lines BL, based on data loaded onto the page buffer circuit 115. For example, the page buffer circuit 115 may apply the first bit line voltage VBL1 to unselected bit lines, that is, each connected with a memory cell not to be programmed (or program-inhibited). For example, during the second precharge operation PR2, the row decoder circuit 115 may maintain a voltage applied to a selected bit line during the first precharge operation PR1.

The page buffer circuit 115 may apply second bit line voltages VBL2 to a selected bit lines, that is, each connected to a memory cell to be programmed. The second bit line voltages VBL2 may be a ground voltage or voltages of which the levels are similar to the ground voltage. The second bit line voltages VBL2 may be voltages which are the same as each other or different from each other.

When the second precharge operation PR2 is performed, voltages (e.g., voltages on drain nodes of the memory cells MC6) of the memory cells MC6 connected with selected string selection lines and selected bit lines may be the second bit line voltages VBL2. Accordingly, memory cells corresponding to the selected string selection lines and the selected bit lines may be set so as to be programmed (i.e., to a program target).

Voltages of the memory cells MC6 connected with selected string selection lines and unselected bit lines may be the first bit line voltages VBL1. Accordingly, memory cells corresponding to the selected string selection lines and the unselected bit lines may be set so as to program-inhibited.

The string selection transistors SSTa and SSTb connected to the unselected string selection lines may be turned off. Accordingly, memory cells corresponding to unselected string selection lines may be set so as to be program inhibited. Voltages of the memory cells MC6 connected to the unselected string selection lines may be the first bit line voltages VBL1.

The program operation PGM may be performed between the third time T3 and the fourth time T4. During the program operation PGM, the row decoder circuit 113 may apply a program voltage VPGM to a selected word line and pass voltages VPASS to unselected word lines.

The pass voltages VPASS may be high voltages for turning on the memory cells MC1 to MC6. The pass voltages VPASS may be voltages which are the same as each other or different from each other. The program voltage VPGM may be higher than the pass voltages VPASS.

When the program operation VPGM is performed, voltages of channels of memory cells which correspond to the selected word line, the selected string selection lines, and the selected bit lines may be the second bit line voltages VBL2, and the program voltage VPGM may be applied to gates thereof. Threshold voltages of memory cells may be increased due to a potential difference between the second bit line voltages VBL2 and the program voltage VPGM.

At the program operation VPGM, voltages of channels of memory cells which correspond to the selected word line, the selected string selection lines, and unselected bit lines may be increased from the first bit line voltages VBL1 or from voltages similar to the first bit line voltages VBL1 due to the coupling. Accordingly, memory cells may not be programmed.

At the program operation VPGM, voltages of channels of memory cells which correspond to unselected word lines, the selected string selection lines, and the selected bit lines may be increased from the second bit line voltages VBL2 due to the coupling. Accordingly, memory cells may not be programmed.

At the program operation VPGM, voltages of channels of memory cells which correspond to the unselected word lines, the selected string selection lines, and the unselected bit lines may be increased from the first bit line voltages VBL1 due to the coupling. Accordingly, memory cells may not be programmed.

At the program operation VPGM, voltages of channels of memory cells which correspond to the word lines, the unselected string selection lines, and the bit lines may be increased from the first bit line voltages VBL1 due to the coupling. Accordingly, memory cells may not be programmed.

According to an exemplary embodiment of the disclosure, the first bit line voltages VBL1 may be applied to all bit lines at the first precharge operation PR1 regardless of data loaded onto the page buffer circuit 115. Accordingly, voltages of channels of a portion of program-inhibited memory cells may be increased from the first bit line voltages VBL1 higher than the second bit line voltages VBL2. This may mean that the boosting of channels of program-inhibited memory cells is improved and thus reliability of the nonvolatile memory device 110 is improved.

The recovery operation RCV may be performed between the fourth time T4 and the fifth time T5. During the recovery operation RCV, voltages on the bit lines BL, the string selection lines SSL, and the word lines WL may be discharged to a ground voltage or a voltage similar to the ground voltage.

The verification operation VFY is performed between the fifth time T5 and the sixth time T6. During the verification operation VFY, whether selected memory cells are programmed to target states may be determined. For example, in the case where two bits are programmed at each memory cell, each of the selected memory cells may be programmed to have one of an erase state and first to third program states. In the case where three bits are programmed at each memory cell, each of the selected memory cells may be programmed to have one of an erase state and first to seventh program states.

Threshold voltage distribution ranges of the program states may be higher than a threshold voltage distribution range of the erase state. Different program states may have different threshold voltage distribution ranges. A voltage of a lower boundary in a threshold voltage distribution range of each program state may be used as a verification voltage of each program state.

During the verification operation VFY, whether memory cells are normally programmed may be determined using verification voltages corresponding to the program states. For example, each of the memory cells having a threshold voltage lower than a verification voltage corresponding to a program state, from among the programmed memory cells, may be determined as not reaching a target program state (i.e., as being program fail). When the number of program fail bits (i.e., the number of memory cells not reaching target program states) is less than a threshold value, a result of the verification operation VFY may be determined as program pass. When the number of program fail bits (i.e., the number of memory cells not reaching target program states) exceeds the threshold value, a result of the verification operation VFY may be determined as program fail.

When a result of the verification operation VFY indicates the program fail, a next program loop may be performed from a seventh time T7. For example, the first precharge operation PR1 may be performed at the seventh time T7, the second precharge operation PR2 at an eighth time T8, the program operation PGM at a ninth time T9, and the recovery operation RCV at a tenth time T10.

When a result of the verification operation VFY indicates the program fail, a level of the program voltage VPGM may be stepped up at a next program loop.

As described with reference to FIG. 3, during the first precharge operation PR1, the page buffer circuit 115 may supply the first bit line voltages VBL1 to the bit lines BL regardless of data loaded thereon. During the second precharge operation PR2, the page buffer circuit 115 may supply the first bit line voltages VBL1 and the second bit line voltages VBL2 to the bit lines BL, based on data loaded thereon.

To store write data at selected memory cells, the write data has been loaded on the page buffer circuit 115, in detail, on digital frontend storage circuits connected with bit lines in the page buffer circuit 115. The first precharge operation PR1 may be performed regardless of data loaded onto the page buffer circuit 115. At the first precharge operation PR1 of a first program loop for programming write data at selected memory cells, the write data may be loaded onto the digital frontend storage circuits of the page buffer circuit 115. The second precharge operation PR2 may be performed after the write data is loaded. That is, since an operation where the write data is loaded onto the page buffer circuit 115 is shadowed by the first precharge operation PR1, an operating speed of the nonvolatile memory device 110 may be improved.

To shadow loading of write data in the first precharge operation PR1, the first precharge operation PR1 may be performed by a first precharge circuit which applies voltages to bit lines BL regardless of data loaded onto the digital frontend storage circuits. The second precharge operation PR2 may be performed by a second precharge circuit which applies voltages to the bit lines BL based on data loaded onto the digital frontend storage circuits. The first precharge circuit and the second precharge circuit may be independent of each other.

In FIG. 3, an embodiment of the disclosure is exemplified as: (1) a first operation where voltages on the bit lines BL are adjusted to the first bit line voltages VBL1 and the second bit line voltages VBL2 and (2) a second operation where voltages on the string selection lines SSL are adjusted to the first string selection line voltages VSSL1 and the second string selection line voltages VSSL2 are simultaneously performed at the second time T2. However, the scope and spirit of the disclosure may not be limited thereto. For example, the first operation and the second operation may be performed sequentially at an interval of time. For example, the first operation may be performed after the second operation is performed.

Figure 4:
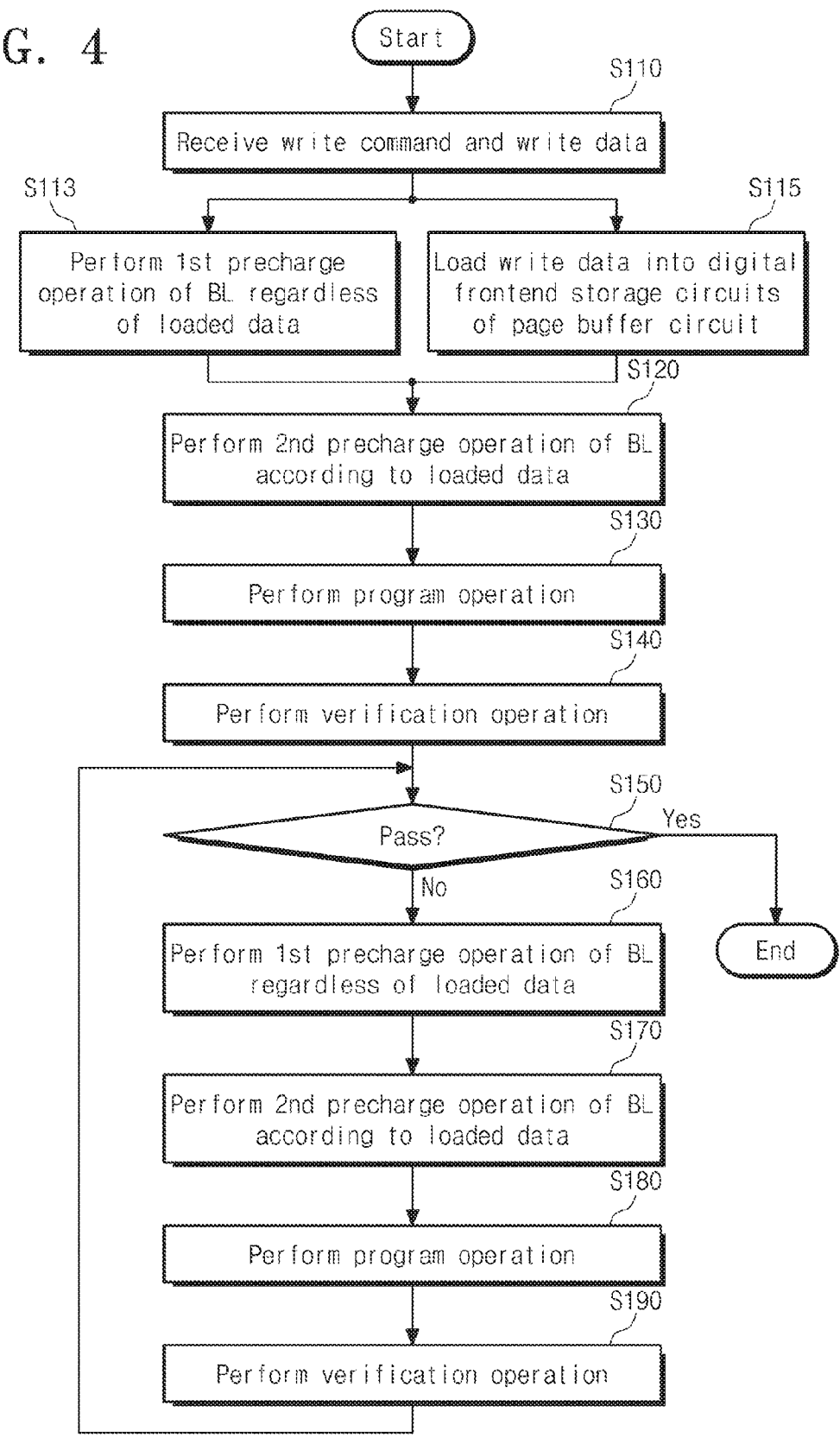
FIG. 4 is a flow chart schematically illustrating an operating method of a nonvolatile memory device according to an exemplary embodiment of the disclosure.

FIG. 4 is a flow chart schematically illustrating an operating method of a nonvolatile memory device 110 according to an exemplary embodiment of the disclosure. In exemplary embodiments, a method where the nonvolatile memory device 110 stores write data at selected memory cells is illustrated in FIG. 4.

Referring to FIGS. 1 to 4, in step S110, the nonvolatile memory device 110 may receive a write command and write data from an external device (e.g., a controller). The write command may be provided to the control logic circuit 119. The control logic circuit 119 may control the row decoder circuit 113, the page buffer circuit 115, and the data input/output circuit 117 in response to the write command. The write data may be stored at the page buffer circuit 115 through the data input/output circuit 117.

In step S113, the first precharge operation PR1 on bit lines BL may be performed through the row decoder circuit 113 and the page buffer circuit 115 regardless of data loaded onto the page buffer circuit 115. At the same time, in step S115, the write data stored at the page buffer circuit 115 may be loaded onto digital frontend storage circuits of the page buffer circuit 115.

In step S120, the second precharge operation PR2 on the bit lines BL may be performed through the row decoder circuit 113 and the page buffer circuit 115, based on data loaded onto the digital frontend storage circuits.

In step S130, the row decoder circuit 113 and the page buffer circuit 115 may perform the program operation PGM. After execution of the recovery operation RCV, in step S140, the row decoder circuit 113 and the page buffer circuit 115 may perform the verification operation VFY.

Steps S113 to S140 may compose a first program loop in which the write data is written at selected memory cells. In the first program loop, an operation in which the write data is loaded onto the digital frontend storage circuits of the page buffer circuit 115 may be shadowed by the first precharge operation PR1.

In step S150, whether the verification operation VFY is passed may be determined. When a result of the verification operation VFY indicates program pass, writing of the write data may be ended. When a result of the verification operation VFY indicates program fail, step S160 may be performed.

In step S160, the row decoder circuit 113 and the page buffer circuit 115 may perform the first precharge operation PR1 on the bit lines BL regardless of data loaded onto the page buffer circuit 115.

In step S170, row decoder circuit 113 and the page buffer circuit 115 may perform the second precharge operation PR2 on the bit lines BL, based on data loaded onto the page buffer circuit 115.

In step S180, the row decoder circuit 113 and the page buffer circuit 115 may perform the program operation PGM. After execution of the recovery operation RCV, in step S190, the verification operation VFY may be performed. Afterwards, step S150 may be again performed.

Steps S160 to S190 may compose second and following program loops in which the write data is written at the selected memory cells.

Figure 5:
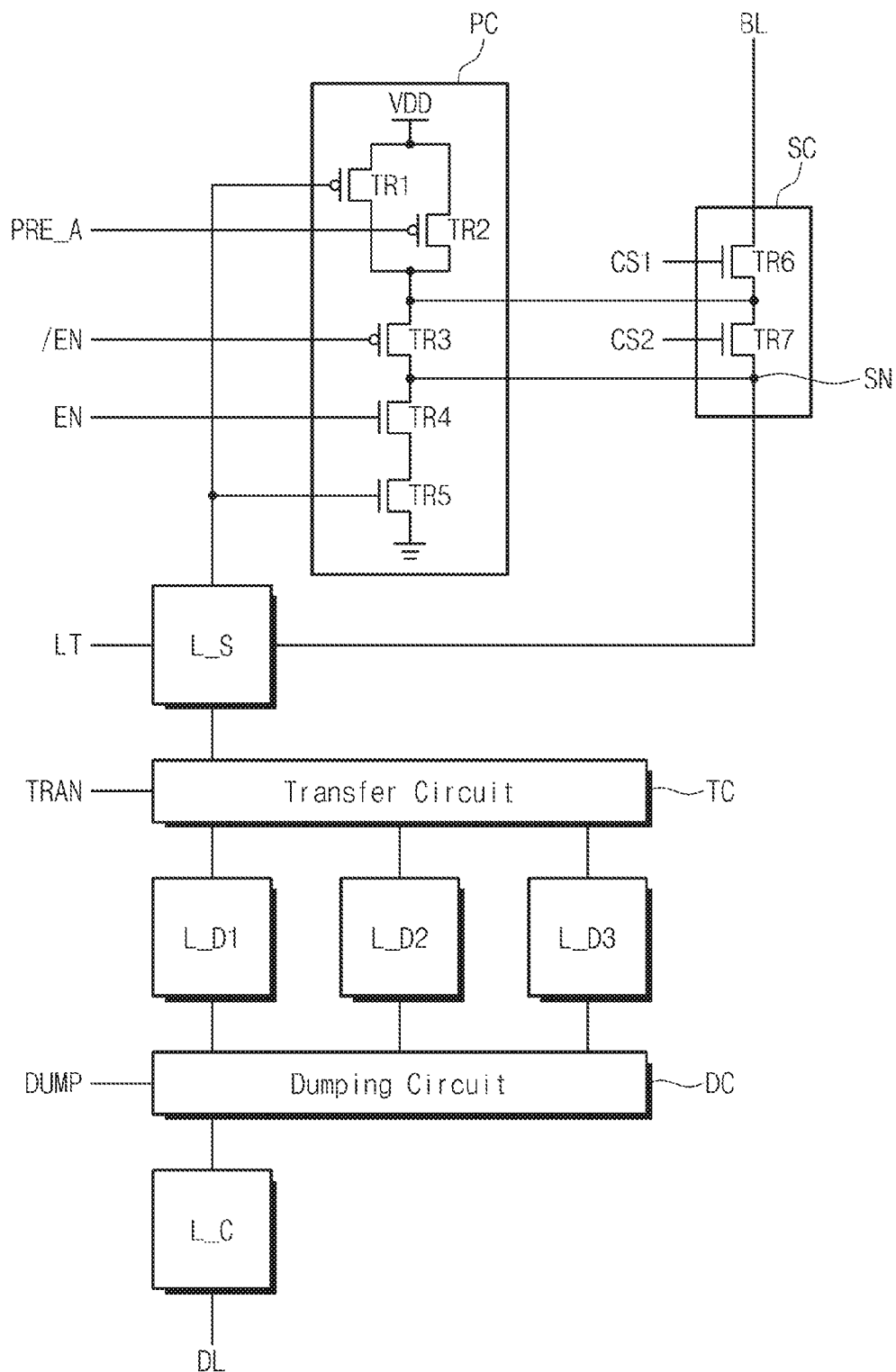
FIG. 5 is a block diagram schematically illustrating a page buffer circuit according to an exemplary embodiment of the disclosure.

FIG. 5 is a block diagram schematically illustrating a page buffer circuit 115 according to an exemplary embodiment of the disclosure. In exemplary embodiments, components of the page buffer circuit 115 corresponding to one bit line BL are illustrated in FIG. 5.

Referring to FIGS. 1, 2, and 5, the page buffer circuit 115 may include cache latches L_C, a dumping circuit DC, data latches L_D1 to L_D3, a transfer circuit TC, a sense latch L_S LT, a precharge circuit PC, and selection circuits SC.

The cache latch L_C may temporarily store a bit transferred from the data input/output circuit 117 or a bit to be transferred to the data input/output circuit 117 through line DL.

The dumping circuit DC may operate in response to a dump signal DUMP from the control logic circuit 119. The dumping circuit DC may set or reset the first to third data laches L_D1 to L_D3 based on a bit stored at the cache latch L_C. Furthermore, the dumping circuit DC may set or reset the cache latch L_C based on a bit stored at one of the first to third data latches_D1 to L_D3.

The transfer circuit TC may operate in response to a transfer signal TRAN from the control logic circuit 119. The transfer circuit TC may set or reset the sense latch L_S based on bits loaded onto the first to third data latches L_D1 to L_D3. Furthermore, the transfer circuit TC may set or reset one of the first to third data latches L_D1 to L_D3 based on a bit loaded onto the sense latch L_S.

The sense latch L_S may control the precharge circuit PC based on a loaded value. Furthermore, the sense latch L_S may latch a voltage on the bit line BL through node SN in response to a latch signal LT from the control logic circuit 119. The sense latch L_S may be a digital frontend storage circuit of the page buffer circuit 115.

The precharge circuit PC may precharge the bit line BL in response to a precharge signal PRE_A or based on data loaded onto the sense latch L_S. The precharge circuit PC may include first to fifth transistors TR1 to TR5.

The first and second transistors TR1 and TR2 may be connected in parallel between the third transistor TR3 and a power node VDD. The first transistor TR1 may be turned on or off according to a bit loaded onto the sense latch L_S. The second transistor TR2 may be turned on or off according to the precharge signal PRE_A from the precharge logic PL of the control logic circuit 119.

The fourth and fifth transistors TR4 and TR5 may be connected in series between the third transistor TR3 and a ground node. The third transistor TR3 may be turned on or off according to an inverted enable signal /EN. The fourth transistor TR4 may be turned on or off according to the enable signal EN. The fifth transistor TR5 may be turned on or off according to a bit loaded onto the sense latch L_S.

The selection circuit SC may include sixth and seventh transistors TR6 and TR7. The sixth and seventh transistors TR6 and TR7 may be turned on or off in response to first and second selection signals CS1 and CS2, respectively. Opposite ends of the seventh transistor TR7 may be respectively connected with opposite ends of the third transistor TR3. The sixth and seventh transistors TR6 and TR7 may be connected in series between the bit line BL and the sense latch L_S.

Figure 6:
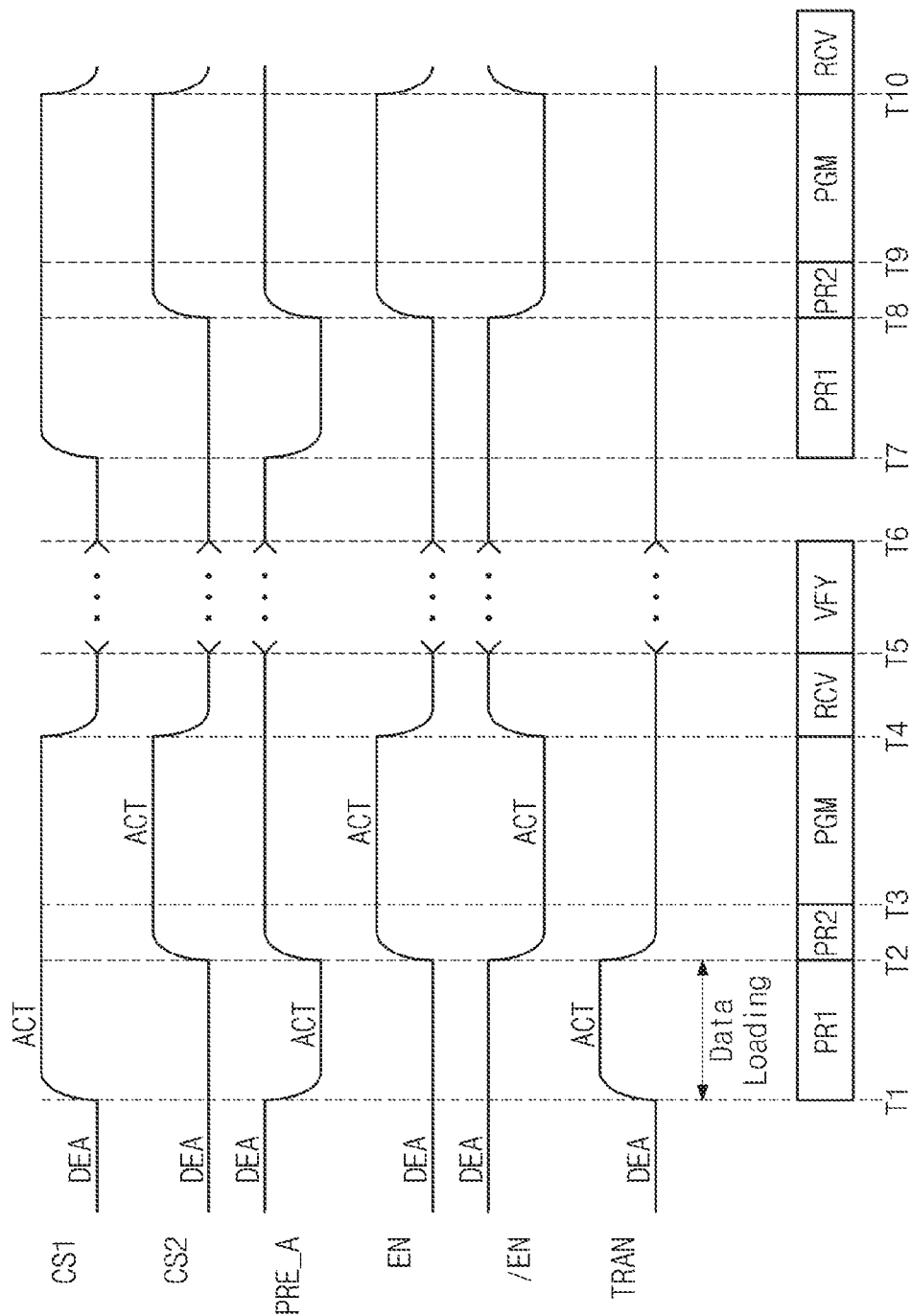
FIG. 6 is a timing diagram schematically illustrating control signals applied to a page buffer circuit when write data is written at selected memory cells.

FIG. 6 is a timing diagram schematically illustrating control signals applied to a page buffer circuit 115 when write data is written at selected memory cells. In FIG. 6, the abscissa represents time, and the ordinate represents active states of signals. In exemplary embodiments, changes in voltages when data is written at memory cells MC may be illustrated in FIG. 6.

Referring to FIGS. 1 to 3, 5, and 6, a program loop may be performed between a first time T1 and a sixth time T6. A first precharge operation PR1 may be performed at the first time T1. During the first precharge operation PR1, a first selection signal CS1 may transition from an inactive state DEA to an active state ACT, and the second selection signal CS2 may remain at the inactive state DEA. A precharge signal PRE_A may transition from the inactive state DEA to the active state ACT. An enable signal EN and an inverted enable signal /EN may remain at the inactive state DEA. A transfer signal TRAN may transition from the inactive state DEA to the active state ACT.

As the first selection signal CS1 and the precharge signal PRE_A transition to the active state ACT, the second transistor TR2 of the precharge circuit PC and the sixth transistor TR6 of the selection circuit SC may be turned on. The power node VDD may be connected to the bit line BL through the second transistor TR2 and the sixth transistor TR6. That is, the bit lines BL may be precharged regardless of data loaded onto the sense latch L_S of the page buffer circuit 115. The second transistor TR2 may be the first precharge circuit which is used at the first precharge operation.

As the transfer signal TRAN transitions to the active state ACT, the sense latch L_S may be set or reset according to bits loaded onto the first to third data latches L_D1 to L_D3. That is, write data may be loaded onto the sense latch L_S of the page buffer circuit 115. In exemplary embodiments, loading of the write data may be shadowed by the first precharge operation PRE A second precharge operation PR2 is performed at the second time T2. During the second precharge operation PR2, the first selection signal CS1 may remain at the active state ACT, and the second selection signal CS2 may transition from the inactive state DEA to the active state ACT. The precharge signal PRE_A may transition from the active state ACT to the inactive state DEA. The enable signal EN and the inverted enable signal /EN may transition from the inactive state DEA to the active state ACT. The transfer signal TRAN may transition from the active state ACT to the inactive state DEA.

The second transistor TR2 may be turned off when the precharge signal PRE_A transitions to the inactive state DEA. The third and fourth transistors TR3 and TR4 may be turned on when the enable signal EN and the inverted enable signal /EN transition to the active state ACT. The seventh transistor TR7 may be turned on when the second selection signal CS2 transitions to the active state ACT.

One of the first transistor TR1 and the fifth transistor TR5 may be turned on according to a bit loaded onto the sense latch L_S, while the other thereof may be turned off according thereto. When the first transistor TR1 is turned on, the power node VDD may be connected with the bit line BL through the first, third, sixth, and seventh transistors TR1, TR3, TR6, and TR7. That is, the first bit line voltages VBL1 on unselected bit lines may be maintained. When the fifth transistor TR5 is turned on, a ground node may be connected with the bit line BL through the fourth to seventh transistors TR4 to TR7. That is, selected bit lines may be precharged with the second bit line voltages VBL2.

A program operation PGM may be carried out at the third time T3. States of signals may be maintained while the program operation PGM is performed.

A recovery operation RCV may be performed at the fourth time T4. During the recovery operation RCV, control signals may be set to the inactive state DEA.

Afterwards, a verification operation VFY may be performed between the fifth time T5 and the sixth time T6.

An embodiment of the disclosure is exemplified as a digital frontend storage circuit is the sense latch L_S. However, the scope and spirit of the disclosure may not be limited thereto. For example, in the case where the page buffer circuit 115 does not include the sense latch L_S, one of the first to third data latches L_D1 to L_D3 may be used as the digital frontend storage circuit.

Figure 7:
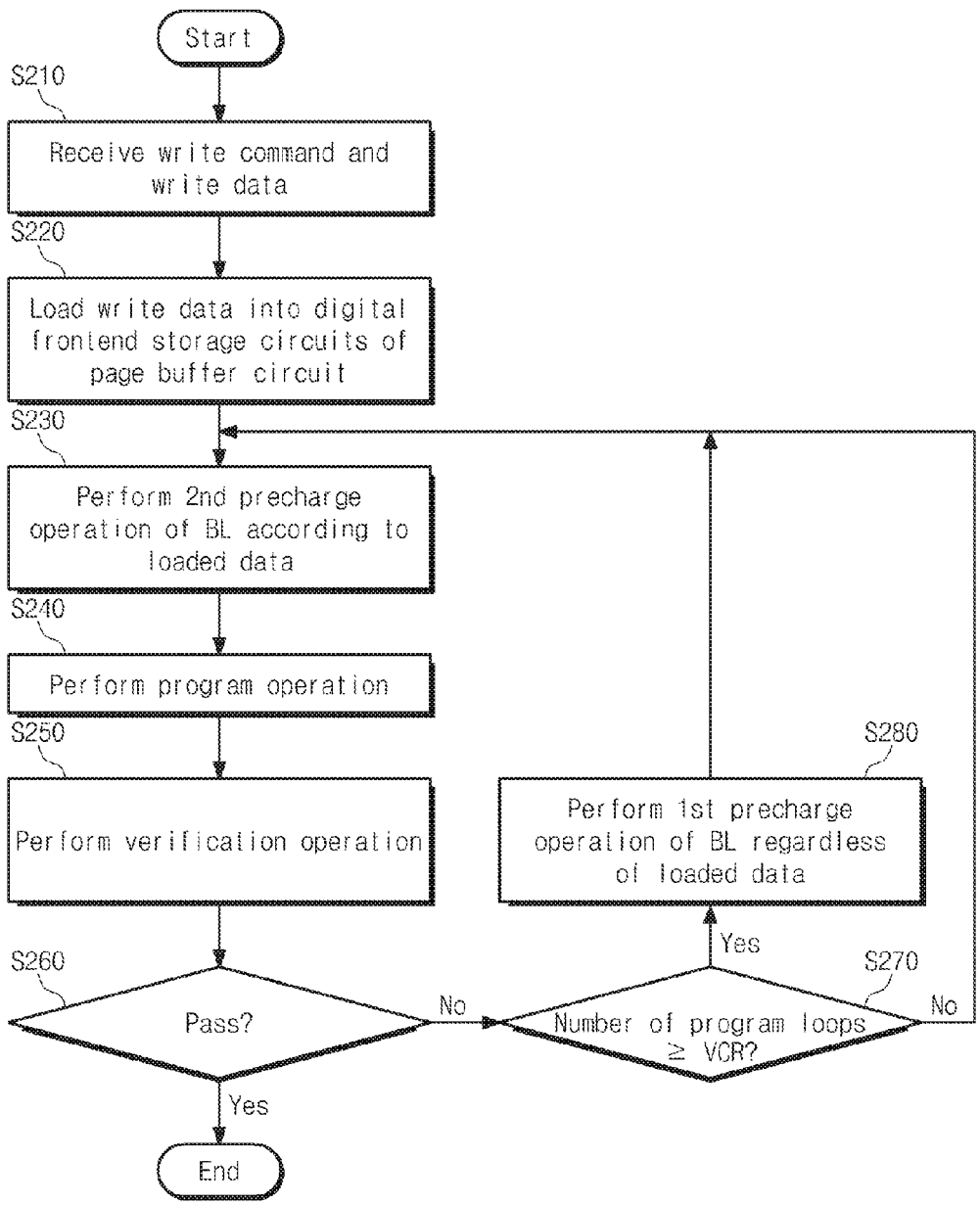
FIG. 7 is a flow chart schematically illustrating an operating method of a nonvolatile memory device according to another exemplary embodiment of the disclosure.

FIG. 7 is a flow chart schematically illustrating an operating method of a nonvolatile memory device 110 according to another exemplary embodiment of the disclosure. In exemplary embodiments, another method where the nonvolatile memory device 110 stores write data at selected memory cells is illustrated in FIG. 7.

Referring to FIGS. 1 to 3 and 7, in step S210, the nonvolatile memory device 110 may receive a write command and write data from an external device (e.g., a controller). The write command may be provided to the control logic circuit 119. The control logic circuit 119 may control the row decoder circuit 113, the page buffer circuit 115, and the data input/output circuit 117 in response to the write command. The write data may be stored at the page buffer circuit 115 through the data input/output circuit 117.

In step S220, the nonvolatile memory device 110 may load the write data stored at the data input/output circuit 117 onto digital frontend storage circuits of the page buffer circuit 115.

In step S230, the row decoder circuit 113 and the page buffer circuit 115 may perform the second precharge operation PR2 on the bit lines BL, based on data loaded onto the digital frontend storage circuits. In step S240, the row decoder circuit 113 and the page buffer circuit 115 may perform the program operation PGM. In step S250, the row decoder circuit 113 and the page buffer circuit 115 may perform the verification operation VFY.

Unlike an operating method described with reference to FIG. 4, a first precharge operation PR1 in which the bit lines BL are precharged regardless of data loaded onto the digital frontend storage circuits of the page buffer circuit 115 may not be performed in steps S230 to S250. Steps S230 to S250 in which the first precharge operation PR1 is not performed may compose a first program loop.

In step S260, whether the verification operation VFY is passed may be determined. When a result of the verification operation VFY indicates program pass, writing of the write data may be ended. When a result of the verification operation VFY indicates program fail, step S270 may be performed.

In step S270, whether the number of program loops is greater than or equal to a threshold value VCR may be determined. For example, the number of program loops which are executed up to the present in response to the write command may be compared with the threshold value VCR. Step S230 may be executed when the number of program loops is smaller than the threshold value VCR. That is, the first program loop may be performed. Step S280 may be executed when the number of program loops is greater than or equal to the threshold value VCR.

In step S280, the row decoder circuit 113 and the page buffer circuit 115 may perform the first precharge operation PR1 in which the bit lines BL are precharged regardless of data loaded onto the digital frontend storage circuits of the page buffer circuit 115. Afterwards, step S230 may be carried out. Steps S280 and S230 to S250 may compose a second program loop.

To sum up, the first program loop may be performed repeatedly before the number of first program loops equals the threshold value VCR. In the first program loop, a second precharge operation PR2 on the bit lines BL may be performed using data loaded onto the page buffer circuit 115. A second program loop may be performed when the number of first program loops equals or exceeds the threshold value VCR. In the second program loop, the first precharge operation PR1 which is not associated with data loaded onto the page buffer circuit 115 and the second precharge operation PR2 which is associated with data loaded onto the page buffer circuit 115 may be performed with respect to the bit lines BL.

Figure 8:
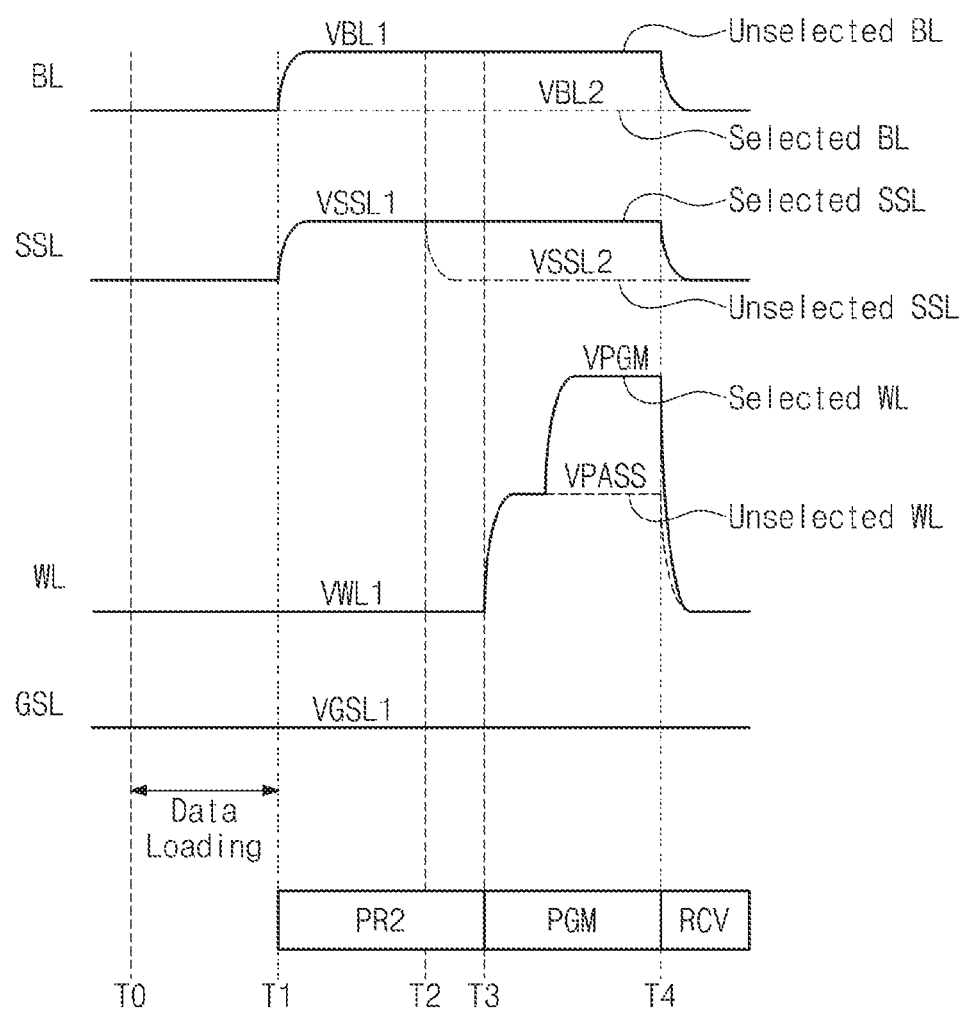
FIG. 8 is a timing diagram schematically illustrating another embodiment in which a row decoder circuit and a page buffer circuit apply voltages to a memory cell array.

FIG. 8 is a timing diagram schematically illustrating another embodiment in which a row decoder circuit and a page buffer circuit apply voltages to a memory cell array. As described with reference to FIG. 7, a portion of a first program loop firstly performed when data is written at selected memory cells is illustrated in FIG. 8. In FIG. 8, the abscissa represents time, and the ordinate represents voltages on bit lines BL, string selection lines SSL, word lines WL, and ground selection lines GSL.

Referring to FIGS. 1, 2, 5, 7, and 8, at T0, write data may be loaded onto a digital frontend storage circuit of the page buffer circuit 115, for example, onto the sense latch L_S.

After the write data is loaded onto the sense latch L_S of the page buffer circuit 115, a first program loop may commence from a first time T1.

A second precharge operation PR2 may be performed between the first time T1 and a third time T3. The page buffer circuit 115 may apply the first bit line voltages VBL1 and the second bit line voltages VBL2 to the bit lines BL, based on data loaded onto the cache latch L_S (e.g., the page buffer circuit 115 may apply one of the first bit line voltage VBL1 and the second bit line voltage VBL2 to a bit line BL, based on data loaded onto the cache latch L_S). The row decoder circuit 113 may apply the first string selection line voltages VSSL1 to the string selection lines SSL. The row decoder circuit 113 may apply the first word line voltages VWL1 to the word lines WL and the first ground selection line voltages VGSL1 to the ground selection lines GSL.

At a second time T2, the row decoder circuit 113 may maintain voltages on selected string selection lines with the first string selection line voltages VSSL1 and may apply the second string selection line voltages VSSL2 to unselected string selection lines.

A program operation PGM may be performed at the third time T3, and a recovery operation RCV may be performed at a fourth time T4. Changes in voltages after the third time T3 may be substantially the same as those described with reference to FIG. 4, and a description thereof is thus omitted.

A second program loop may be performed when the first program loop is performed a number of times equaling the threshold value VCR. The second program loop may be performed substantially the same as that described with reference to third to sixth times T3 to T6 of FIG. 3 except that loading of write data is not performed.

Figure 9:
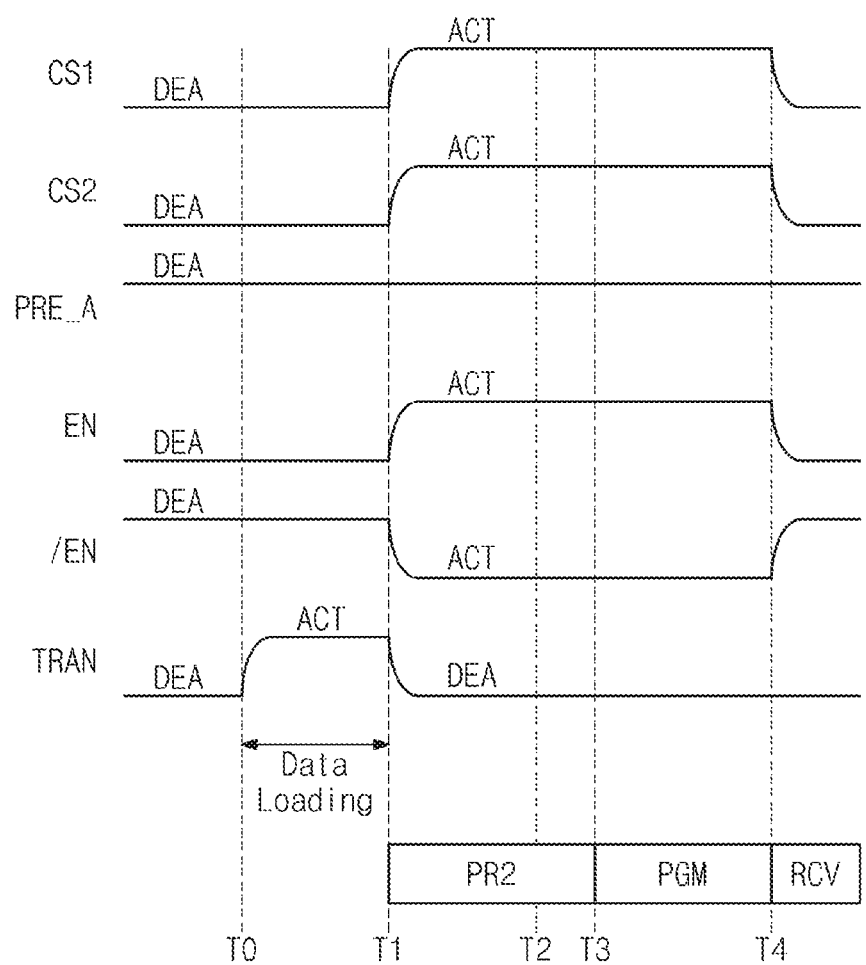
FIG. 9 is a timing diagram schematically illustrating control signals applied to a page buffer circuit when write data is written at selected memory cells.

FIG. 9 is a timing diagram schematically illustrating control signals applied to a page buffer circuit 115 when write data is written at selected memory cells. In FIG. 9, the abscissa represents time, and the ordinate represents active states of signals. In exemplary embodiments, changes in voltages when data is written at memory cells MC using a timing diagram of FIG. 8 may be illustrated in FIG. 9.

Referring to FIGS. 1, 2, 5, and 9, at T0, the transfer signal TRAN may transition from an inactive state DEA to an active state ACT, and write data may be loaded onto a digital frontend storage circuit of the page buffer circuit 115, for example, onto the cache latch L_C thereof.

At a first time T1, the transfer signal TRAN may transition from an active state ACT to an inactive state DEA. Each of first and second control signals CS1 and CS2, an enable signal EN, and an inverted enable signal /EN may transition from the inactive state DEA to the active state ACT. A precharge signal PRE_A may remain at the inactive state DEA. States of signals may be maintained during a second precharge operation PR2, that is, between the first time T1 and a third time T3.

A program operation PGM may be performed at the third time T3, and a recovery operation RCV may be performed at a fourth time T4. States of signals after the third time T3 may be substantially the same as those described with reference to third and sixth times T3 to T6 of FIG. 6, and a description thereof is thus omitted.

Figure 10:
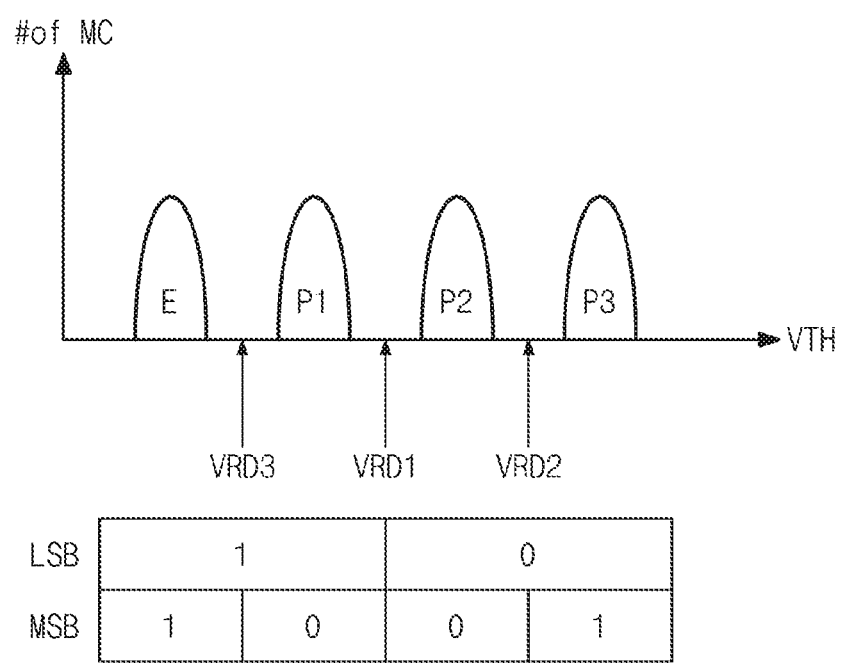
FIG. 10 is a diagram illustrating a state where write data is written at selected memory cells.

FIG. 10 is a diagram illustrating a state where write data is written at selected memory cells. In FIG. 10, the abscissa represents threshold voltages of memory cells MC, and the ordinate represents the number of memory cells MC. That is, a distribution of threshold voltages of memory cells at which write data is programmed is illustrated in FIG. 10. An embodiment of the disclosure is exemplified in FIG. 10 as two bits, that is, a least significant bit (LSB) and a most significant bit (MSB) are written at each memory cell.

Each memory cell where data including MSB of "1" and LSB of "1" is written may have an erase state E. Each memory cell where data including MSB of "0" and LSB of "1" is written may have a first program state P1. A threshold voltage distribution of the first program state P1 may be higher than that of the erase state E. Each memory cell where data including MSB of "0" and LSB of "0" is written may have a second program state P2. A threshold voltage distribution of the second program state P2 may be higher than that of the first program state P1. Each memory cell where data including MSB of "1" and LSB of "0" is written may have a third program state P3. A threshold voltage distribution of the third program state P3 may be higher than that of the second program state P2.

First to third read voltages VRD1 to VRD3 may be used to read data written at memory cells. The first read voltage VRD1 may have a level between the threshold voltage distribution of the first program state P1 and a threshold voltage distribution of the second program state P2. The second read voltage VRD2 may have a level between the threshold voltage distribution of the second program state P2 and a threshold voltage distribution of the third program state P3. The third read voltage VRD3 may have a level between the threshold voltage distribution of the ease state E and a threshold voltage distribution of the first program state P1.

Figure 11:
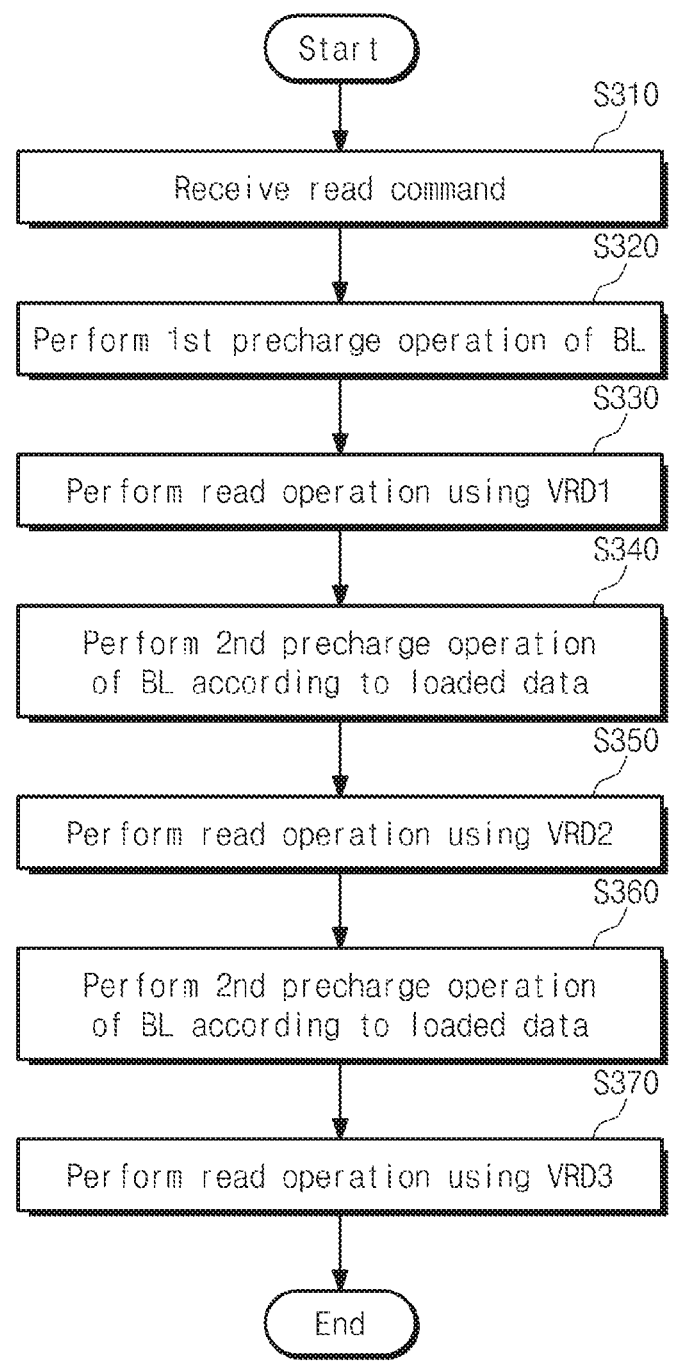
FIG. 11 is a flow chart schematically illustrating an operating method of a nonvolatile memory device according to still another exemplary embodiment of the disclosure.

FIG. 11 is a flow chart schematically illustrating an operating method of a nonvolatile memory device 110 according to still another exemplary embodiment of the disclosure. A method of reading data written at memory cells is illustrated in FIG. 11.

Referring to FIGS. 1, 2, 5, 10, and 11, in step S310, a read command may be received. For example, the read command may be provided to the control logic circuit 119 from an external device (e.g., a controller).

In step S320, the nonvolatile memory device 110 may perform a first precharge operation PR1 on bit lines BL. For example, the precharge circuit PC of the page buffer circuit 115 may perform the first precharge operation PR1 in which the bit lines BL are precharged regardless of data loaded onto the page buffer circuit 115.

In step S330, the row decoder circuit 113 and the page buffer circuit 115 may perform a read operation using a first read voltage VRD1. When the read operation using the first read voltage VRD1 is completed, LSBs written at memory cells may be determined. A read result may be sensed by the sense latch L_S, and the sensed result may be stored at one of the data latches L_D1 to L_D3.

In step S340, the precharge circuit PC of the page buffer circuit 115 may perform a second precharge operation PR2 on the bit lines, based on data loaded onto the page buffer circuit 115. For example, the page buffer circuit 115 may select bit lines corresponding to memory cells each having a threshold voltage higher than or equal to the first read voltage VRD1, that is, memory cells of which the LSBs are determined as being "0". The page buffer circuit 115 may not select bit lines corresponding to memory cells each having a threshold voltage lower than or equal to the first read voltage VRD1, that is, memory cells of which the LSBs are determined as being "1". The page buffer circuit 115 may precharge the selected bit lines and the unselected bit lines differently from each other. For example, the bit line BL may be precharged through the sense latch L_S set by the read operation using the first read voltage VRD1 or as the sense latch L_S is set by a read result stored at the data laches L_D1 to L_D3.

In step S350, the row decoder circuit 113 and the page buffer circuit 115 may perform a read operation using a second read voltage VRD2. When the read operation using the second read voltage VRD2 is completed, MSBs of memory cells of which the LSBs are "0" may be determined. A read result may be sensed by the sense latch L_S, and the sensed result may be stored at one of the data latches L_D1 to L_D3.

In step S360, the precharge circuit PC of the page buffer circuit 115 may perform the second precharge operation PR2 on the bit lines BL, based on data loaded onto the page buffer circuit 115. For example, the page buffer circuit 115 may select bit lines corresponding to memory cells each having a threshold voltage lower than or equal to the first read voltage VRD1, that is, memory cells of which the LSBs are determined as being "1". The page buffer circuit 115 may not select bit lines corresponding to memory cells each having a threshold voltage higher than or equal to the first read voltage VRD1, that is, memory cells of which the LSBs are determined as being "0". The page buffer circuit 115 may precharge the selected bit lines and the unselected bit lines differently from each other. For example, the sense latch L_S may be set by the read result stored at the data latches L_D1 to L_D3, and the bit lines BL may be precharged according to data loaded onto the sense latch L_S. In step S370, the row decoder circuit 113 and the page buffer circuit 115 may perform a read operation using a third read voltage VRD3. When the read operation using the third read voltage VRD3 is completed, MSBs of memory cells of which the LSBs are "1" may be determined.

Figure 12:
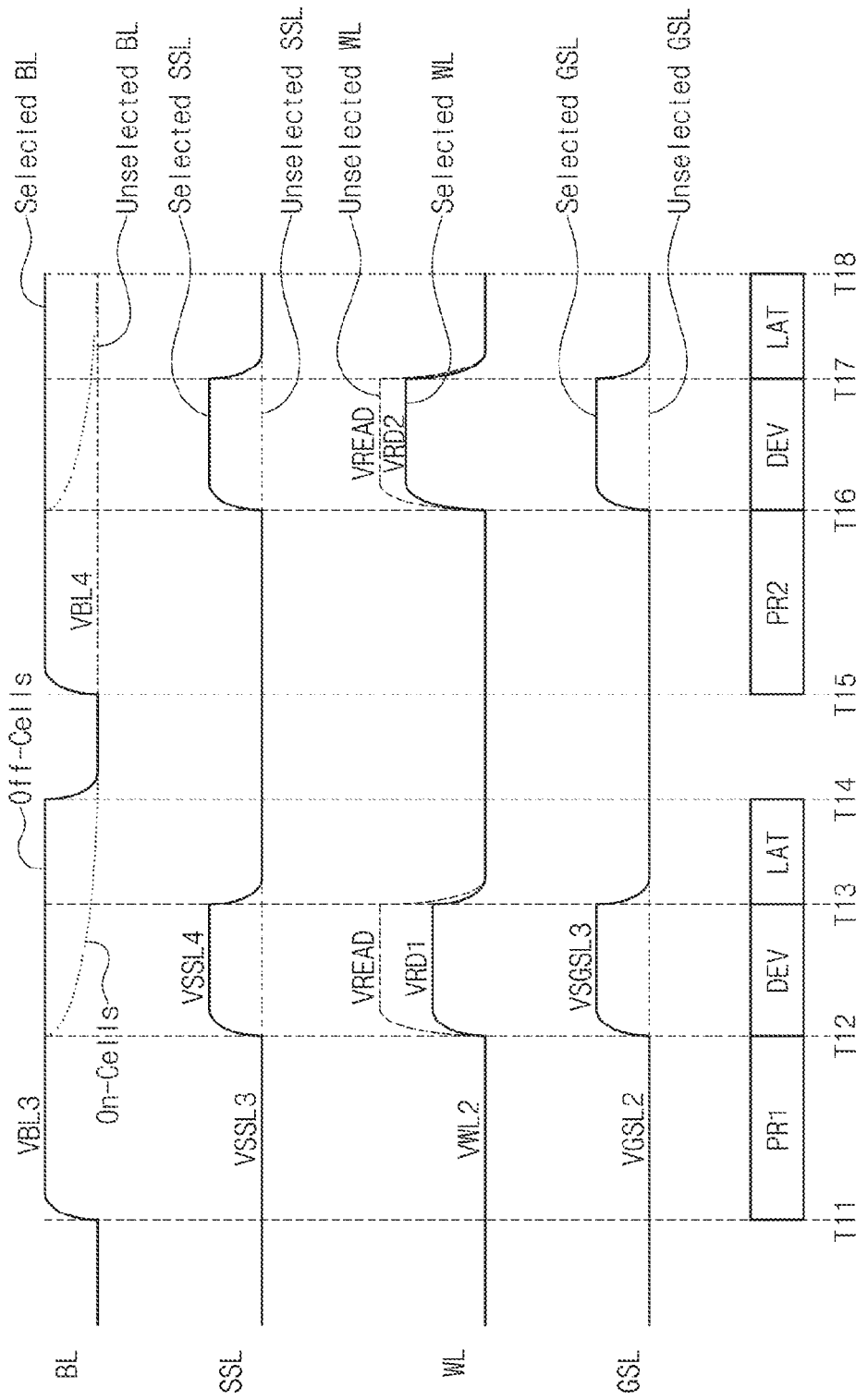
FIG. 12 is a timing diagram schematically illustrating still another embodiment in which a row decoder circuit and a page buffer circuit apply voltages to a memory cell array.

FIG. 12 is a timing diagram schematically illustrating still another embodiment in which a row decoder circuit and a page buffer circuit apply voltages to a memory cell array. Changes in voltages when data is written at memory cells through a manner described with reference to FIG. 11 are illustrated in FIG. 12. In FIG. 12, the abscissa represents time, and the ordinate represents voltages on bit lines BL, string selection lines SSL, word lines WL, and ground selection lines GSL.

At T11, there may be performed a first precharge operation PR1 in which the bit lines BL are precharged regardless of data loaded onto the page buffer circuit 115. At T11, the page buffer circuit 115 may apply third bit line voltages VBL3 to the bit lines BL. The third bit line voltages VBL3 may be a power supply voltage or positive voltages of which the levels are similar to or lower than that of the power supply voltage.

The row decoder circuit 113 may apply third string selection line voltages VSSL3 to string selection lines SSL. The third string selection line voltages VSSL3 may be voltages for turning off the string selection transistors SSTa and SSTb. The third string selection line voltages VSSL3 may be a ground voltage or voltages of which the levels are similar to that of the ground voltage.

The row decoder circuit 113 may apply the second word line voltages VWL2 to the word lines WL. The second word line voltages VWL2 may be voltages for turning off memory cells MC. The second word line voltages VWL2 may be the ground voltage or voltages of which the levels are similar to that of the ground voltage.

The row decoder circuit 113 may apply second ground selection line voltages VGSL2 to the ground selection lines GSL. The second ground selection line voltages VGSL2 may be voltages for turning off the ground selection transistors GST. The second ground selection line voltages VGSL2 may be the ground voltage or voltages of which the levels are similar to the ground voltage.

A read operation may be executed between T12 and T14. The read operation may include a develop operation DEV and a latch operation LAT.

The bit lines BL may be floated at T12. For example, the bit lines BL may be electrically separated from the precharge circuit PC.

The row decoder circuit 113 may apply fourth string selection line voltages VSSL4 to selected string selection lines. The fourth string selection line voltages VSSL4 may be voltages for turning on the string selection transistors SSTa and SSTb. The fourth string selection line voltages VSSL4 may be the power supply voltage or high voltages of which the levels are higher than that of the power supply voltage. The row decoder circuit 113 may maintain voltages on unselected string selection lines with the third string selection line voltages VSSL3.

The row decoder circuit 113 may apply pass read voltages VREAD to unselected word lines. The pass read voltages VREAD may be voltages for turning on memory cells. The pass read voltages VREAD may be voltages higher than the power supply voltage. The pass read voltages VREAD may be the same as each other or different from each other. The row decoder circuit 113 may apply a first read voltage VRD1 to a selected word line.

The row decoder circuit 113 may apply third ground selection line voltages VGSL3 to selected ground selection lines. The third ground selection line voltages VGSL3 may be voltages for turning on the ground selection transistors GST. The third ground selection line voltages VGSL3 may be the power supply voltage or high voltages of which the levels are higher than that of the power supply voltage. The row decoder circuit 113 may maintain voltages on unselected ground selection lines with the second ground selection line voltages VGSL2.

Although not illustrated in FIG. 12, the ground voltage or a low voltage of which the level is lower than that of the ground voltage may be applied to a common source line CSL.

During the develop operation DEV, the string selection transistors SSTa and SSTb of a selected plane in a selected memory block BLKa may be turned on by the fourth string selection line voltages VSSL4. The ground selection transistors GST in the selected plane may be turned on by the third ground selection line voltage VGSL3. In the selected plane, memory cells connected to unselected word lines may be turned on by the pass read voltage VREAD. In the selected plane, memory cells connected to the selected word line may be turned on or off by the first read voltage VRD1.

For example, each memory cell at which an LSB of "1" is written may be an on-cell which is turned on by the first read voltage VRD1. Voltages on bit lines corresponding to on-cells may be discharged to the common source line CSL. Thus, voltages on bit lines corresponding to on-cells may be lowered during the develop operation DEV.

Each memory cell at which an LSB of "0" is written may be an off-cell which is turned off by the first read voltage VRD1. Voltages on bit lines corresponding to off-cells may not be discharged to the common source line CSL. Thus, during the develop operation DEV, voltages on bit lines corresponding to off-cells may be maintained, not decreased.

The latch operation LAT may be performed at T13. The sense latch L_S may latch voltages on bit lines. For example, each of the sense latches L_S connected to bit lines corresponding to on-cells may latch a value of "1", and each of the sense latches L_S connected to bit lines corresponding to off-cells may latch a value of "0". LSBs of selected memory cells may be stored at the sense latches L_S by the latch operation LAT. Afterwards, LSBs stored at the sense latches L_S may be stored the data latches L_D1 to L_D3.

At T15, there may be performed a second precharge operation PR2 in which the bit lines BL are precharged according to data loaded onto the page buffer circuit 115. At T15, the page buffer circuit 115 may apply the third bit line voltages VBL3 to selected bit lines, respectively. For example, there may be selected bit lines corresponding to memory cells which are determined at a read operation, which is performed between T12 and T14, as storing "0" as the LSB. The row decoder circuit 113 may apply fourth bit line voltages VBL4 to unselected bit lines, respectively. The fourth bit line voltages VBL4 may be the ground voltage or low voltages of which the levels are similar to that of the ground voltage. Memory cells which are determined at the read operation, performed between T12 and T14, as storing "1" as the LSB may be unselected.

A read operation may be performed between T16 and T18. The read operation may include a develop operation DEV and a latch operation LAT.

At T16, the bit lines BL may be floated. For example, the bit lines BL may be electrically separated from the precharge circuit PC.

The row decoder circuit may apply fourth string selection line voltages VSSL4 to selected string selection lines, respectively. The row decoder circuit 113 may maintain voltages on unselected string selection lines with the third string selection line voltages VSSL3.

The row decoder circuit 113 may apply the pass read voltages VREAD to the unselected word lines, respectively. The row decoder circuit 113 may apply a second read voltage VRD2 to the selected word line.

The row decoder circuit 113 may apply the third ground selection line voltages VGSL3 to the selected ground selection lines, respectively. The row decoder circuit 113 may maintain voltages on the unselected ground selection lines with the second ground selection line voltages VGSL2.

Although not illustrated in FIG. 12, the ground voltage or a low voltage of which the level is similar to that of the ground voltage may be applied to the common source line CSL.

Memory cells at which MSBs of "0" are written may be on-cells turned on by the second read voltage VRD2. Voltages on bit lines corresponding to on-cells may be lowered during the develop operation DEV.

Memory cells at which MSBs of "1" are written may be off-cells turned off by the second read voltage VRD2. Voltages on bit lines corresponding to off-cells may be maintained, not decreased, during the develop operation DEV.

The latch operation LAT may be performed at T17.

Afterwards, a read operation using a third read voltage VRD3 may be performed in a manner the same as that described with reference to T15 to T18.

Figure 13:
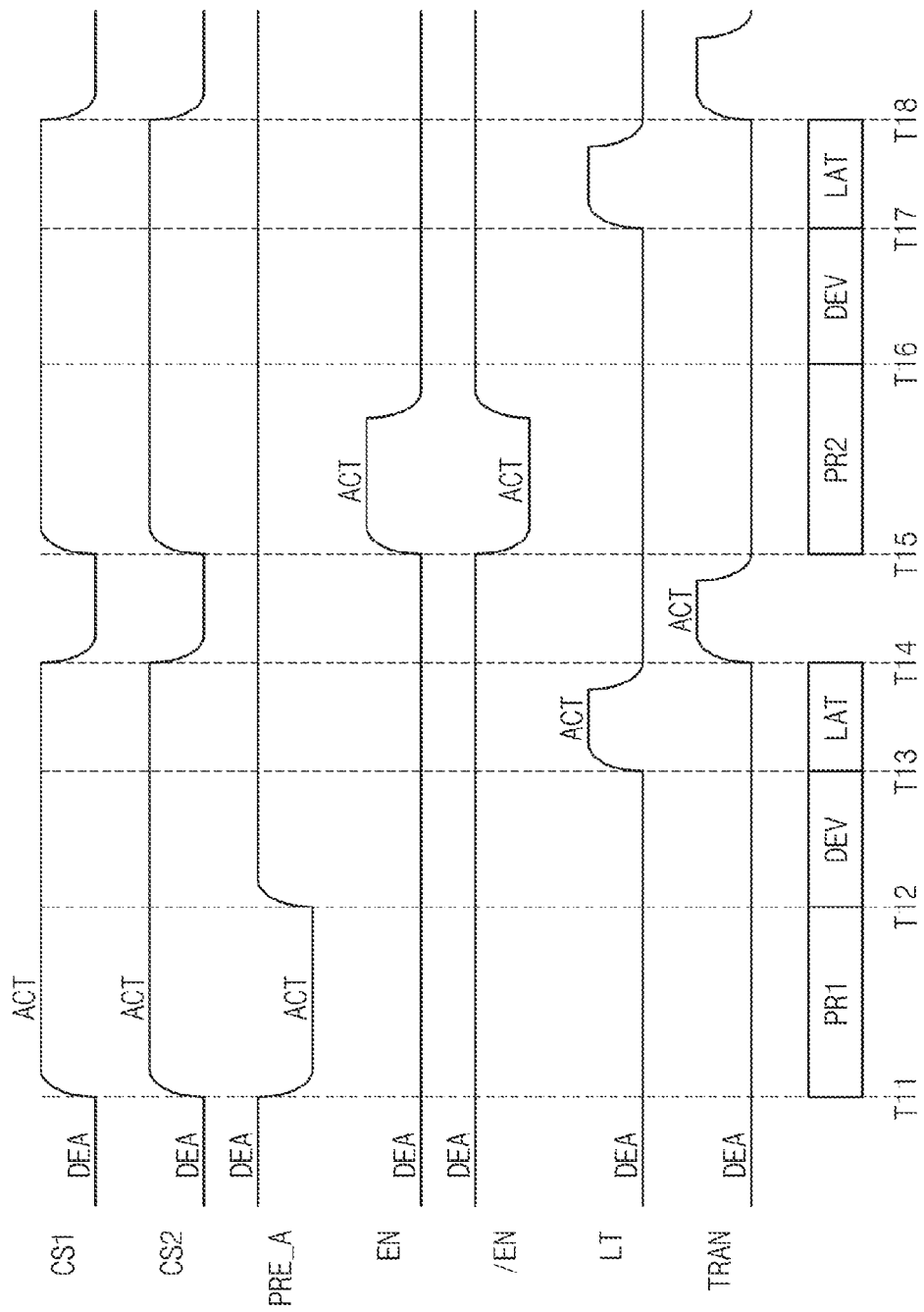
FIG. 13 is a timing diagram schematically illustrating signals applied to a page buffer circuit when data is written at selected memory cells.

FIG. 13 is a timing diagram schematically illustrating signals applied to a page buffer circuit when data is written at selected memory cells. In FIG. 13, the abscissa represents time, and the ordinate represents active states of signals. Changes in signals when data is written at memory cells MC based on a timing diagram of FIG. 12 are illustrated in FIG. 13.

Referring to FIGS. 1, 2, 5, 12, and 13, a first precharge operation PR1 may be performed at a 11th time T11. When the first precharge operation is performed, each of the first and second control signals CS1 and CS2 and the precharge signal PRE_A may transition from an inactive state DEA to an active state ACT. Each of the enable signal EN, the inverted enable signal /EN, the latch signal LT, and the transfer signal TRAN may remain at the inactive state DEA.

Since the second, sixth and seventh transistors TR2, TR6 and TR7 are turned on, the power node VDD may be connected to bit lines. That is, the bit lines may be precharged with the power supply voltage or a voltage of which the level is similar to that of the power supply voltage.

A develop operation DEV may be executed at T12. During the develop operation DEV, the precharge signal PRE_A may transition from the active state ACT to the inactive state DEA. In this case, since the second transistor TR2 is turned off, the bit lines BL may be electrically separated from the precharge circuit PC. Accordingly, the bit lines BL may be floated.

The latch operation LAT may be performed at T13. During the latch operation LAT, the latch signal LT may transition from the inactive state DEA to the active state ACT and may then transition from the active state ACT to the inactive state DEA. The sense latch L_S may latch a voltage on a bit line BL when the latch signal LT is activated.

At T14, the first and second control signals CS1 and CS2 may transition from the active state ACT to the inactive state DEA. The transfer signal TRAN may transition from the inactive state DEA to the active state ACT and may then transition from the active state ACT to the inactive state DEA. A value stored at the sense latch L_S may be transferred (e.g., dumped) to one of the data latches L_D1 to L_D3 when the transfer signal TRAN is activated.

A second precharge operation PR2 may be performed at T15. During the second precharge operation PR2, the first and second control signals CS1 and CS2 may transition from the inactive state DEA to the active state ACT. The enable signal EN and the inverted enable signal /EN may transition from the inactive state DEA to the active state ACT.

One of the power node VDD and the ground node may be connected with a bit line BL, based on a value (e.g., 1-bit data) loaded onto the sense latch L_S. For example, a selected bit line may be connected to the power node VDD, and an unselected bit line may be connected to the ground node.

A develop operation DEV, a latch operation LAT, and a transfer operation may be respectively performed at T16, T17, and T18 in a manner substantially the same as described between T12 and T15, and a description thereof is thus omitted.

During a second precharge operation PR2 and a read operation using a third read voltage VRD3, signals may be controlled substantially the same as described with reference to T15 and following times.

Figure 14:
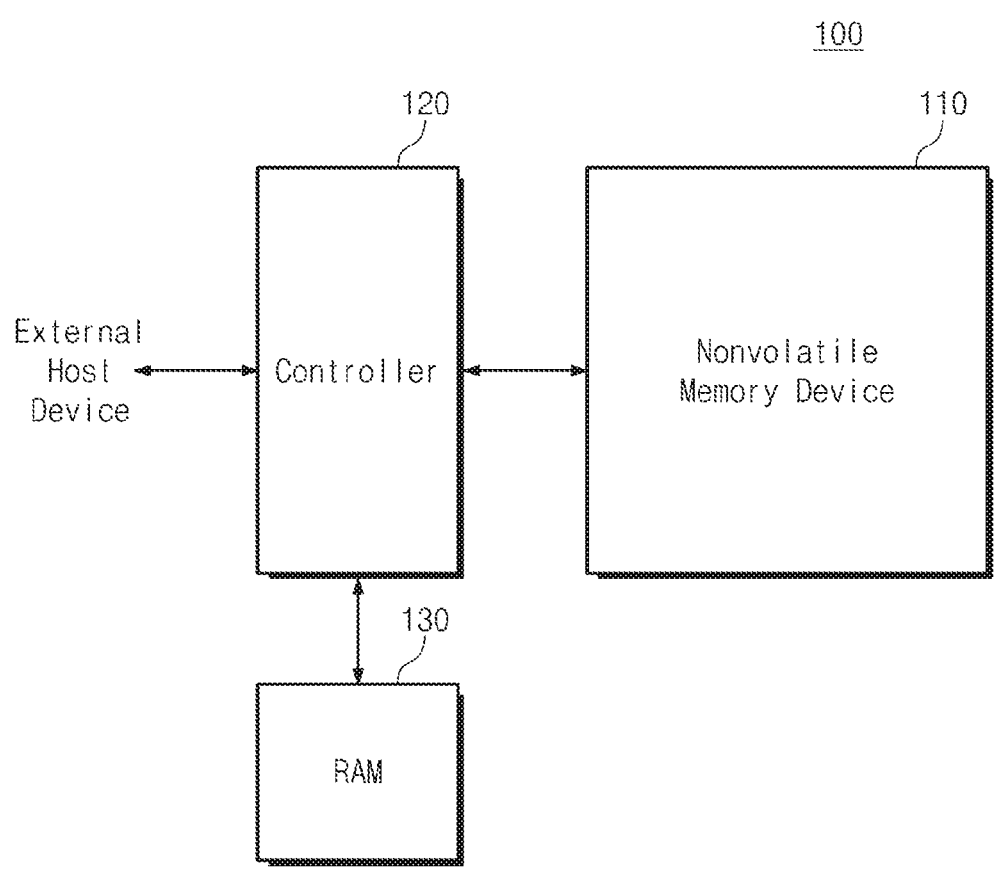
FIG. 14 is a block diagram schematically illustrating a storage device according to an embodiment of the disclosure.

FIG. 14 is a block diagram schematically illustrating a storage device 100 according to an embodiment of the disclosure. Referring to FIG. 14, a storage device 100 may include a nonvolatile memory device 110, a controller 120, and a random access memory (RAM) 130.

The nonvolatile memory device 110 may perform read, write, and erase operations under a control of the controller 120. The nonvolatile memory device 100 may receive a command and an address from the controller 120 through an input/output channel. The nonvolatile memory device 110 may exchange data with the controller 120. For example, the nonvolatile memory device 110 may be configured and operate as described with reference to FIGS. 1 to 13.

The nonvolatile memory device 110 may exchange a control signal with the controller 120. For example, the nonvolatile memory device 110 may receive, from the controller 120, at least one of a chip enable signal /CE for selecting at least one of a plurality of nonvolatile memory chips in the nonvolatile memory device 110, a command latch enable signal CLE indicating that a signal received from the controller 120 through the input/output channel is the command, an address latch enable signal ALE indicating that a signal received from the controller 120 through the input/output channel is an address, a read enable signal /RE generated by the controller 120 at a read operation, periodically toggled, and used to tune timing, a write enable signal /WE activated by the controller 120 when the command or the address is transmitted, a write protection signal /WP activated by the controller 120 to prevent unintended writing or erasing when a power changes, and a data strobe signal DQS used to adjust input synchronization about the data transmitted through the input/output channel and generated from the controller 120 at a write operation so as to be periodically toggled. For example, the nonvolatile memory device 110 may output, to the controller 120, at least one of a ready/busy signal R/nB indicating whether the nonvolatile memory device 110 is performing a program, erase, or read operation and a data strobe signal DQS used to adjust output synchronization about the data and generated from the read enable signal /RE by the nonvolatile memory device 110 so as to be periodically toggled.

The nonvolatile memory device 110 may include a flash memory. However, the scope and spirit of the disclosure may not be limited thereto. For example, the nonvolatile memory device 110 may incorporate at least one of nonvolatile memory devices, such as a phase-change RAM (PRAM), a magnetic RAM (MRAM), a resistive RAM (RRAM), and a ferroelectric RAM (FeRAM).

The controller 120 may control the nonvolatile memory device 110. For example, the controller 120 may control the nonvolatile memory device 110 through an input/output channel and a control channel so as to perform a write, read, or erase operation.

The controller 120 may control the nonvolatile memory device 110 in response to a control of an external host device (not illustrated). The controller 120 may communicate with the external host device based on a format different from the format for communications with the nonvolatile memory device 110. A unit of data which the controller 120 conveys to the nonvolatile memory device 110 may be different from a unit of data which the controller 120 conveys to the external host device.

The controller 120 may use the RAM 130 as a working memory, a buffer memory, or a cache memory. For example, the controller 120 may store data or codes, needed to manage the nonvolatile memory device 110, at the RAM 130. For example, the controller 120 may read data or codes, needed to manage the nonvolatile memory device 110, from the nonvolatile memory device 110 and may load the read data or codes on the RAM 130 for driving.

The RAM 130 may include at least one of a variety of random access memories, such as, but not limited to, a static RAM (SRAM), a dynamic RAM (DRAM), a synchronous DRAM (SRAM), a PRAM, an MRAM, an RRAM, and an FRAM.

The nonvolatile memory device 110 may include a plurality of nonvolatile memory chips. In exemplary embodiments, the controller 120 and the nonvolatile memory chips may be mutually connected based on a channel and a way. One channel may include one data channel and one control channel One data channel may include eight data lines. One control channel may include control lines for transferring the chip enable signal /CE, the command latch enable signal CLE, the address latch enable signal ALE, the read enable signal /RE, the write enable signal /WE, the write protect signal /WP, and the ready/busy signal R/nB.

Nonvolatile memory chips connected to one channel may constitute a way. When being connected to one channel, n nonvolatile memory chips may compose an n-way. Nonvolatile memory chips belonging to one way may share data lines and the control lines for transferring the command latch enable signal CLE, the address latch enable signal ALE, the read enable signal /RE, the write enable signal /WE, and the write protect signal /WP. Each of nonvolatile memory chips belonging to one way may communicate with the controller 120 through dedicated control lines for the chip enable signal /CE and the ready/busy signal R/nB.

The controller 120 may alternately access n-way nonvolatile memory chips connected to one channel. The controller 120 may independently access nonvolatile memory chips connected with different channels. The controller 120 may alternately or simultaneously access nonvolatile memory chips connected with different channels.

In exemplary embodiments, nonvolatile memory chips may be connected with the controller 120 in the form of a wide IO. For example, nonvolatile memory chips connected to different channels may share a control line for a chip enable signal /CE. Nonvolatile memory chips which share the control line for the chip enable signal /CE may be accessed at the same time. Data lines of different channels may be used at the same time, and thus, a wide input/output bandwidth may be implemented.

The storage device 100 may include a solid state drive (SSD) or a hard disk drive (HDD). The storage device 100 may include memory cards, such as PC card (personal computer memory card international association (PCM-CIA)), compact flash (CF) card, smart media card (SM, SMC), memory stick, multimedia card (MMC, RS-MMC, MMCmicro), SD card (SD, miniSD, microSD, SDHC), universal serial bus (USB) memory card, and universal flash storage (UFS). The storage device 100 may include embedded memories, such as embedded MultiMedia card (eMMC), UFS, and PPN (Perfect Page NAND).

In FIG. 14, an embodiment of the disclosure is exemplified as the RAM 130 is disposed outside the controller 120. However, the scope and spirit of the disclosure may not be limited thereto. For example, the storage device 100 may not include the RAM 130 which is disposed outside the controller 120. The controller 120 may use an internal RAM (refer to FIG. 15) as a buffer memory, a working memory, or a cache memory.

Figure 15:
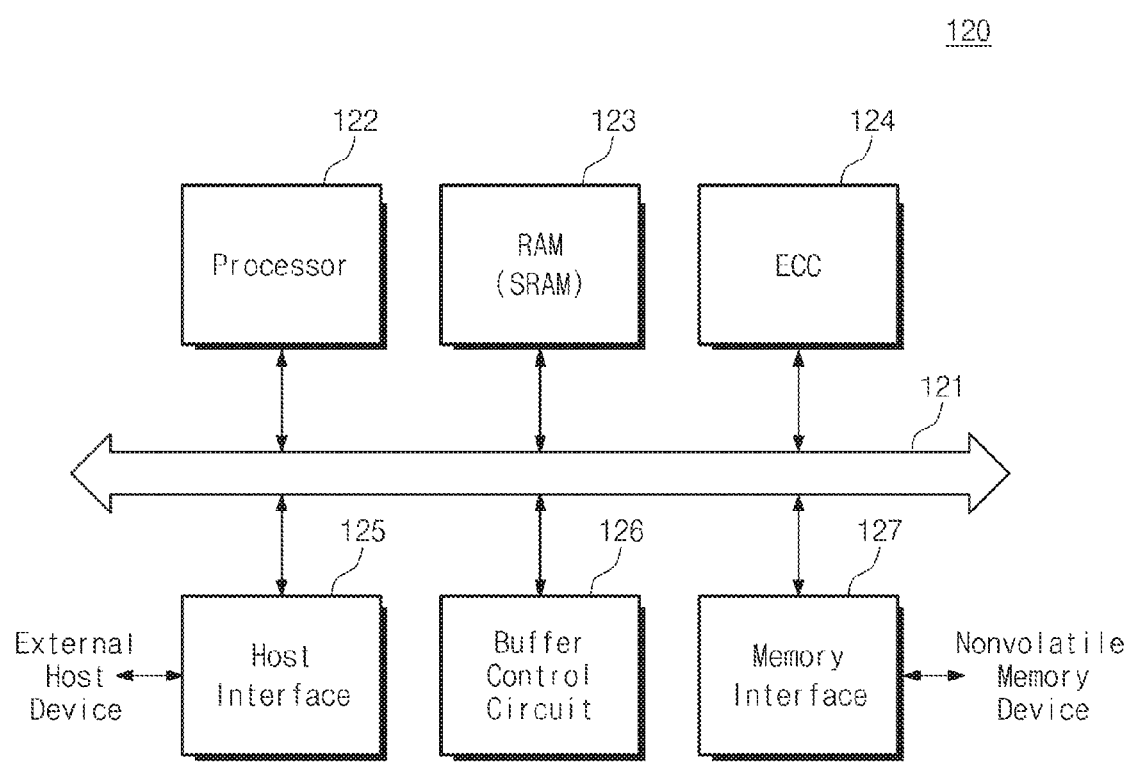
FIG. 15 is a block diagram schematically illustrating a controller according to an embodiment of the disclosure.

FIG. 15 is a block diagram schematically illustrating a controller 120 according to an embodiment of the disclosure. Referring to FIG. 15, a controller 120 may include a bus 121, a processor 122, a RAM 123, an ECC block 124, a host interface 125, a buffer control circuit 126, and a memory interface 127.

The bus 121 may be configured to provide a channel among components of the controller 120.

The processor 122 may control an overall operation of the controller 120 and may execute a logical operation. The processor 122 may communicate with an external host device through the host interface 125, may communicate with the nonvolatile memory device 110 through the memory interface 127, and may communicate with the RAM 130 through the buffer control circuit 126. The processor 122 may control the storage device 100 using the RAM 123 as a working memory, a cache memory, or a buffer memory.

The RAM 123 may be used as a working memory, a cache memory, or a buffer memory of the processor 122. The RAM 123 may store codes or commands that the processor 122 will execute. The RAM 123 may store data processed by the processor 122. The RAM 123 may include an SRAM.

The ECC block 124 may perform an error correction operation. The ECC block 124 may perform error correction encoding based on data to be written at the nonvolatile memory 110 through the memory interface 127. The error correction encoded data may be transferred to the nonvolatile memory device 110 through the memory interface 127. The ECC block 124 may perform error correction decoding on data received through the memory interface 127 from the nonvolatile memory device 110. In exemplary embodiments, the ECC block 124 may be included in the memory interface 127 as a component of the memory interface 127.

The host interface 125 may communicate with the external host device under a control of the processor 122. The host interface 125 may perform communications using at least one of various communication manners, such as a universal serial bus (USB), a serial AT attachment (SATA), a high speed interchip (HSIC), a small computer system interface (SCSI), Firewire, a peripheral component interconnection (PCI), a PCI express (PCIe), a nonvolatile memory express (NVMe), a universal flash storage (UFS), a secure digital (SD), a multimedia card (MMC), eMMC, a dual in-line memory module (DIMM), a registered DIMM (RDIMM), a load reduced DIMM (LRDIMM), and the like.

The buffer control circuit 126 may control the RAM 130 under a control of the processor 122.

The memory interface 127 may communicate with the nonvolatile memory 110 in response to a control of the processor 122. As described with reference to FIG. 1, the memory interface 127 may convey a command, an address, and data to the nonvolatile memory device 110 through the input/output channel. The memory interface 127 may convey a control signal to the nonvolatile memory device 110 through the control channel.

In exemplary embodiments, in the case where the storage device 100 does not include the RAM 130, the controller 120 may not include the buffer control circuit 126.

In exemplary embodiments, the processor 122 may control the controller 120 using codes. The processor 122 may load codes from a nonvolatile memory (e.g., a read only memory) that is implemented in the controller 120. Alternatively, the processor 122 may load codes from the nonvolatile memory device 110 through the memory interface 127.

In exemplary embodiments, the bus 121 of the controller 120 may be divided into a control bus and a data bus. The data bus may transfer data in the controller 120, and the control bus may transfer the following control information in the controller 120: a command and an address. The data bus and the control bus may be independent of each other to prevent mutual interference or influence. The data bus may be connected with the ECC block 124, the host interface 125, the buffer control circuit 126, and the memory interface 127. The control bus may be connected with the processor 122, the RAM 123, the host interface 125, the buffer control circuit 126, and the memory interface 127.

Figure 16:
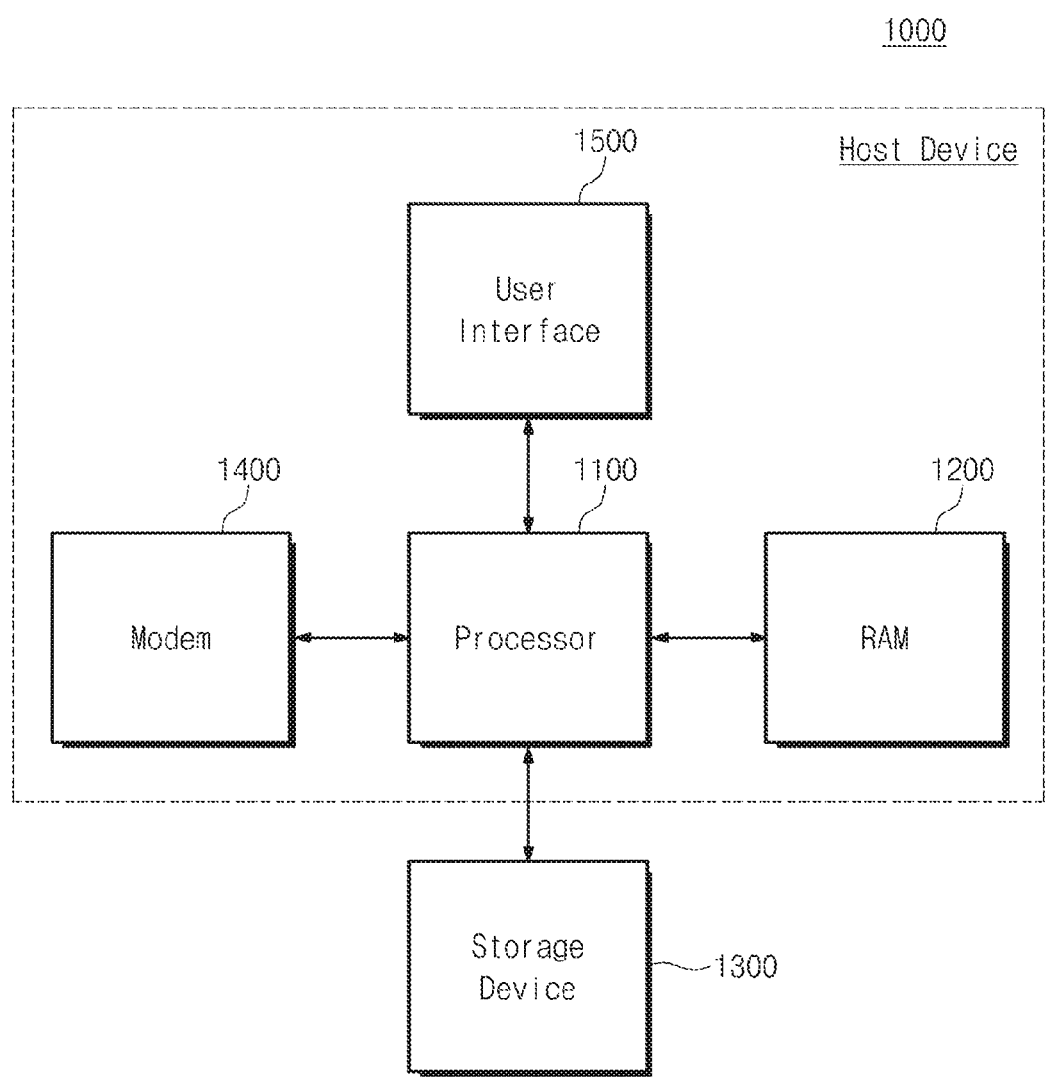
FIG. 16 is a block diagram schematically illustrating a computing device according to an embodiment of the disclosure.

FIG. 16 is a block diagram schematically illustrating a computing device 1000 (e.g., host device) according to an embodiment of the disclosure. Referring to FIG. 16, a computing device 1000 may include a processor 1100, a RAM 1200, a storage device 1300, a modem 1400, and a user interface 1500.

The processor 1100 may control an overall operation of the computing device 1000 and may perform a logical operation. The processor 1100 may be a data processing device which is based on hardware including a circuit physically configured to execute operations expressed by commands included in a code or program. For example, the processor 1100 may be a system-on-chip (SoC). The processor 1100 may be a general purpose processor, a specific-purpose processor, or an application processor.

The RAM 1200 may communicate with the processor 1100. The RAM 1200 may be a main memory of the processor 1100 or the computing device 1000. The processor 1100 may store codes or data at the RAM 1200 temporarily. The processor 1100 may execute codes using the RAM 1200 and may process data. The processor 1100 may execute a variety of software, such as, but not limited to, an operating system and an application, using the RAM 1200. The processor 1100 may control an overall operation of the computing device 1000 using the RAM 1200. The RAM 1200 may include a volatile memory such as, but not limited to, an SRAM, a DRAM, an SDRAM, and the like or a nonvolatile memory such as, but not limited to, a PRAM, an MRAM, an RRAM, an FRAM, and the like.

The storage device 1300 may communicate with the processor 1100. The storage device 1300 may be used to store data for a long time. That is, the processor 110 may store data, which is to be stored for a long time, at the storage device 1300. The storage device 1300 may store a boot image for driving the computing device 1000. The storage device 1300 may store source codes of a variety of software, such as an operating system and an application. The storage device 1300 may store data that is processed by a variety of software, such as an operating system and an application.

In exemplary embodiments, the processor 1100 may load source codes stored at the storage device 1300 onto the RAM 1200 and may execute the codes, and thus, a variety of software, such as an operating system, an application, and the like may be driven. The processor 1100 may load data stored at the storage device 1300 onto the RAM 1200 and may process data loaded onto the RAM 1200. The processor 1100 may store long-term data among data, stored at the RAM 1200, at the storage device 1300.

The storage device 1300 may include a nonvolatile memory, such as, but not limited to, a flash memory, a PRAM, an MRAM, an RRAM, an FRAM, and the like.

The modem 1400 may communicate with an external device under a control of the processor 1100. For example, the modem 1400 may communicate with the external device in a wired or wireless manner. The modem 1400 may communicate with the external device, based on at least one of wireless communications manners such as long term evolution (LTE), WiMax, global system for mobile communication (GSM), code division multiple access (CDMA), Bluetooth, near field communication (NFC), Wi-Fi, radio frequency identification (RFID), and the like or wired communications manners such as universal serial bus (USB), SATA, HSIC, SCSI, Firewire, peripheral component interconnection (PCI), PCI express (PCIe), nonvolatile memory express (NVMe), universal flash storage (UFS), secure digital (SD), SDIO, universal asynchronous receiver transmitter (UART), serial peripheral interface (SPI), high speed SPI (HS-SPI), RS232, inter-integrated circuit (I2C), HS-I2C, integrated-interchip sound (I2S), Sony/Philips digital interface (S/PDIF), multimedia card (MMC), embedded MMC (eMMC), and so on.

The user interface 1500 may communicate with a user under a control of the processor 1100. For example, the user interface 1500 may include user input interfaces such as a keyboard, a keypad, buttons, a touch panel, a touch screen, a touch pad, a touch ball, a camera, a microphone, a gyroscope sensor, a vibration sensor, and the like. The user interface 1500 may further include user output interfaces such as a liquid crystal display (LCD), an organic light-emitting diode (OLED) display device, an active matrix OLED (AMOLED) display device, a light-emitting diode (LED), a speaker, a motor, and the like.

The storage device 1300 may include one of the storage devices 100, 200, and 300 according to embodiments of the disclosure. The processor 1100, RAM 1200, modem 1400, and user interface 1500 may constitute a host device that communicates with the storage device 1300.

According to an exemplary embodiment of the disclosure, positive voltages may be applied to program-inhibited cell strings at a program operation, and thus, the boosting of the program-inhibited cell strings may be improved. This may mean that the reliability of a nonvolatile memory is improved. Furthermore, a precharge circuit for applying positive voltages to all bit lines and a precharge circuit for applying positive voltages to bit lines based on data may be provided independently of each other, and thus, loading of write data may be shadowed. This may mean that an operating speed of the nonvolatile memory device is improved.

While the disclosure has been described with reference to exemplary embodiments, it will be apparent to those skilled in the art that various changes and modifications may be made without departing from the spirit and scope of the disclosure. Therefore, it should be understood that the above embodiments are not limiting, but illustrative.

What is claimed is:

1. A nonvolatile memory device comprising:
a memory cell array including a plurality of memory blocks each including a plurality of cell strings, each cell string including a ground selection transistor, a plurality of memory cells, and a string selection transistor;
a row decoder circuit configured to apply a turn-on voltage to string selection lines, which are connected to string selection transistors of a selected memory block, at a first precharge operation in response to a write command received from an external device; and
a page buffer circuit configured to apply, in response to the write command, a first voltage to bit lines, which are connected to the string selection transistors, through a first precharge circuit at the first precharge operation regardless of loaded data and to apply the first voltage and a second voltage lower than the first voltage to the bit lines through a second precharge circuit at a second precharge operation based on the loaded data, wherein write data is loaded onto the page buffer circuit during the first precharge operation.

2. The nonvolatile memory device of claim 1, wherein during the second precharge operation, the row decoder circuit applies the turn-on voltage to a string selection line selected from the string selection lines and applies a turn-off voltage to an unselected string selection line.

3. The nonvolatile memory device of claim 1, wherein the first precharge circuit comprises a plurality of switches configured to supply, during the first precharge operation, a power supply voltage to the bit lines in response to a control signal.

4. The nonvolatile memory device of claim 1, wherein the second precharge circuit comprises a plurality of switches configured to apply one of a power supply voltage and a ground voltage to each bit line in response to a value of each bit of data loaded onto the page buffer circuit, during the second precharge operation.

5. The nonvolatile memory device of claim 1, wherein the page buffer circuit comprises:
latches corresponding to the bit lines and onto which the write data is loaded;
first transistors connected respectively between the bit lines and a power node and controlled in common by a control signal;
second transistors connected respectively between the bit lines and the power node and turned on or off according to values loaded onto the latches; and
third transistors connected respectively between the bit lines and a ground node and turned on or off according to values loaded onto the latches.

6. The nonvolatile memory device of claim 1, wherein during a program operation, the row decoder circuit is configured to apply a program voltage to a selected word line and a pass voltage to unselected word lines from among word lines connected to memory cells of the selected memory block in response to the write command.

7. The nonvolatile memory device of claim 1, wherein during a verification operation, the page buffer circuit applies a third voltage and a fourth voltage lower than the third voltage to the bit lines through the second precharge circuit, based on data loaded onto the page buffer circuit in response to the write command.

8. The nonvolatile memory device of claim 1, wherein:
the first precharge operation, the second precharge operation, a program operation, and a verification operation which are performed according to the write command compose a program loop,
the program loop is performed iteratively, and
after at least one program loop is performed in response to the write command, the page buffer circuit is configured to apply the first voltage and the second voltage to the bit lines based on data loaded onto the page buffer circuit, during the second precharge operation.

9. The nonvolatile memory device of claim 1, wherein:
in response to a read command received from the external device, the page buffer circuit is configured to apply a third voltage to the bit lines through the first precharge circuit at a first read precharge operation and to apply a first read voltage to a word line selected from word lines connected to memory cells of the selected memory block at a first read operation, and
in response to the read command, the page buffer circuit is configured to latch voltages on the bit lines at the first read operation.

10. The nonvolatile memory device of claim 9, wherein in response to the read command, the page buffer circuit is further configured to apply the third voltage or a fourth voltage lower than the third voltage to the bit lines through the second precharge circuit at a second read precharge operation, based on the latched voltages.

11. A nonvolatile memory device comprising:
a memory cell array having memory cells that are each addressed by one of a plurality of bit lines and one of a plurality of word lines; and
a controller that executes a voltage application operation on the memory cells, wherein the controller:
a) applies, during a first pre-charge operation preceding the voltage application operation, a bit-line select signal to each of the bit lines, and b) applies, during the execution of the voltage application operation, one of a plurality of word-line signals to each of the word lines, wherein during a program operation, the controller further loads, within a data latch and during the first pre-charge operation, data values each of which corresponds to a respective one of the bit lines and indicates whether the bit line is to be selected or unselected for the voltage application operation.

12. The nonvolatile memory device of claim 11, wherein, during the program operation, the controller further applies, during a second pre-charge operation preceding the voltage application operation, the bit-line select signal to each of the bits lines having a corresponding data value within the latch indicating that the bit line is to be selected for the voltage application operation and a bit-line unselect signal to each of the bits lines having a corresponding data value within the latch indicating that the bit line is to be unselected for the voltage application operation.

13. The nonvolatile memory device of claim 12, wherein the controller read second data values from selected memory cells of the memory cell array in a read operation.

14. The nonvolatile memory device of claim 13, wherein the controller applies, during a second pre-charge operation of the read operation, different voltages to the bit lines according to the second data values.

15. The nonvolatile memory device of claim 11, wherein the controller executes operations (a) and (b) multiple times to program the data value into the memory cell.

* * * * *